US011452247B2

(12) United States Patent
Oliverius

(10) Patent No.: US 11,452,247 B2
(45) Date of Patent: Sep. 20, 2022

(54) MULTI-ROW CARRIER TAPE WITH ALTERNATING, STAGGERED DUMMY POCKETS

(71) Applicant: Advantek, Inc., St. Louis, MO (US)

(72) Inventor: Todd M. Oliverius, Richfield, MN (US)

(73) Assignee: Advantek, Inc., St. Louis, MO (US)

( * ) Notice: Subject to any disclaimer, the term of this patent is extended or adjusted under 35 U.S.C. 154(b) by 324 days.

(21) Appl. No.: 16/688,592

(22) Filed: Nov. 19, 2019

(65) Prior Publication Data

US 2020/0163262 A1    May 21, 2020

Related U.S. Application Data

(60) Provisional application No. 62/769,673, filed on Nov. 20, 2018.

(51) Int. Cl.
*H01L 21/673* (2006.01)
*H05K 13/00* (2006.01)

(52) U.S. Cl.
CPC ... *H05K 13/0084* (2013.01); *H01L 21/67333* (2013.01); *H01L 2221/68313* (2013.01)

(58) Field of Classification Search
CPC .... H01L 21/67333; H01L 2221/68313; H05K 13/0084; B65D 73/02

USPC .................................. 206/714, 713, 716, 717
See application file for complete search history.

(56) References Cited

U.S. PATENT DOCUMENTS

| 6,293,404 | B1 | 9/2001 | Bloom |
| 7,021,467 | B2 | 4/2006 | Agari |
| 7,654,392 | B2 | 2/2010 | Agari |
| 2004/0124119 | A1* | 7/2004 | Ahn .................. H05K 13/0084 206/714 |
| 2006/0108259 | A1* | 5/2006 | Agari ................ H01L 21/67333 206/716 |

\* cited by examiner

*Primary Examiner* — Steven A. Reynolds
(74) *Attorney, Agent, or Firm* — Edwin E. Voigt, II

(57) ABSTRACT

A carrier tape has a central portion, and first and second rows of device pockets and dummy pockets. The device pockets are smaller in size than the dummy pockets. The pockets in each of the first and second rows are vertically aligned and are separated vertically from each other by an equal distance. Vertically aligned and adjacent pockets may be horizontally separated relative to each other by a constant dimension, a regularly or irregularly increasing or decreasing dimension, or both a regularly or irregularly increasing or decreasing dimension. Vertically aligned and adjacent pockets may also vary in positioning relative to an upper edge of the carrier tape in an increasing or decreasing regular or irregular dimension or both. The carrier tape may be layered on a reel during transportation.

20 Claims, 8 Drawing Sheets

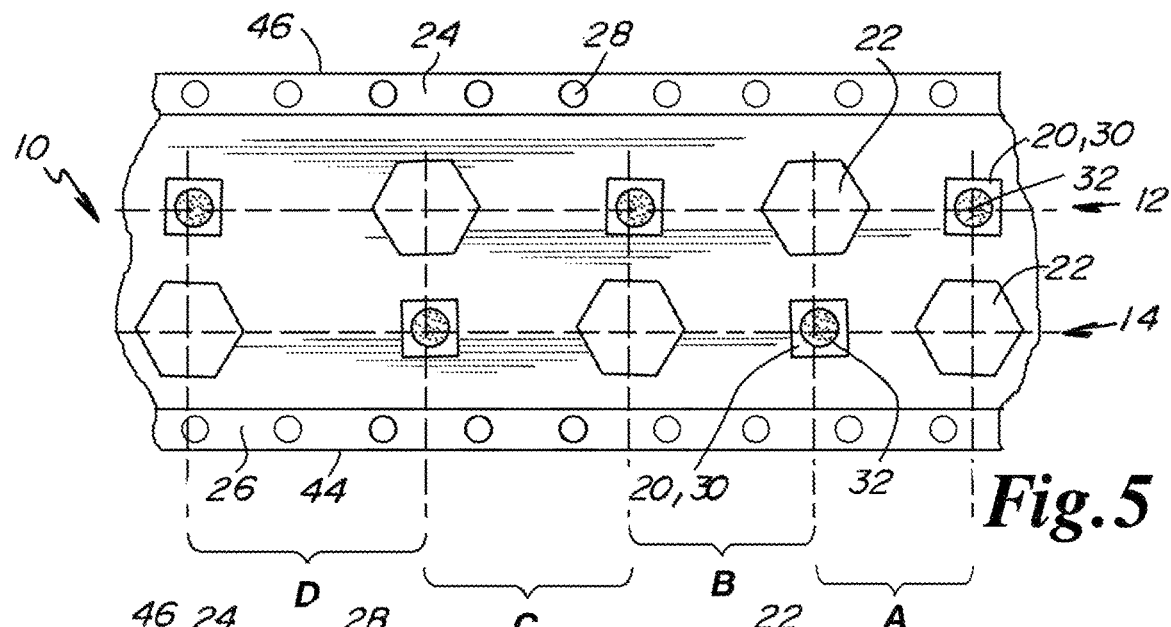
Fig.5
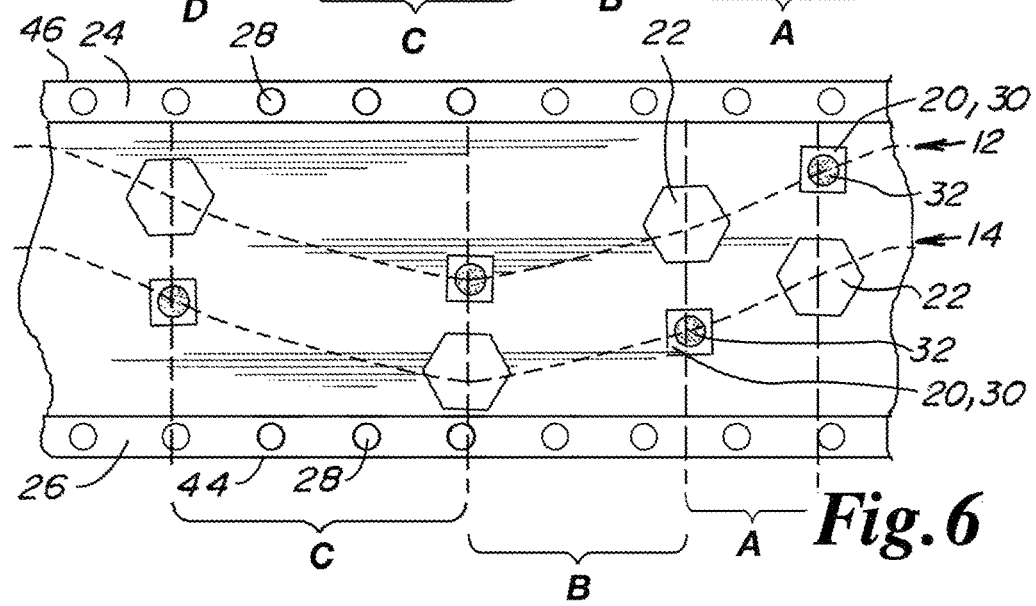
Fig.6
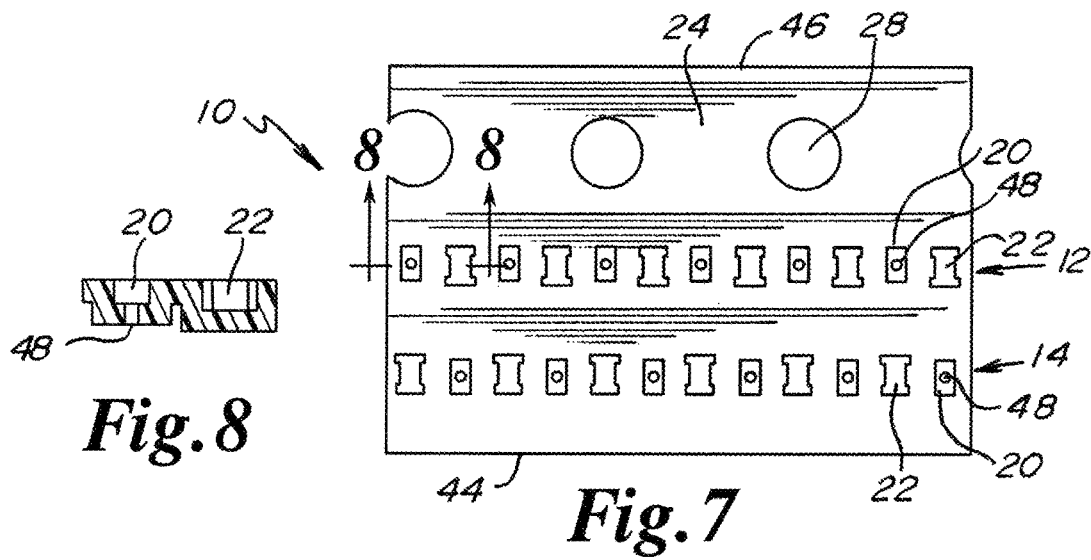
Fig.8
Fig.7

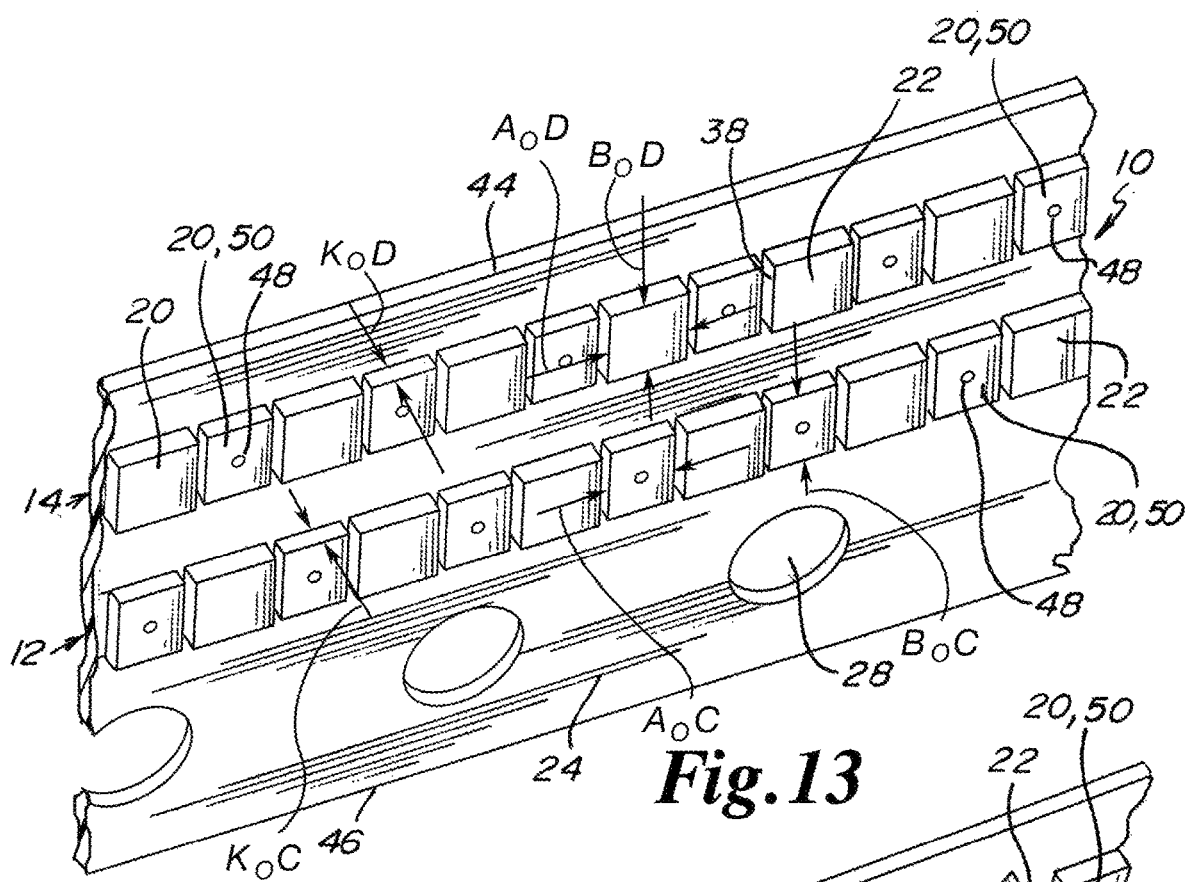
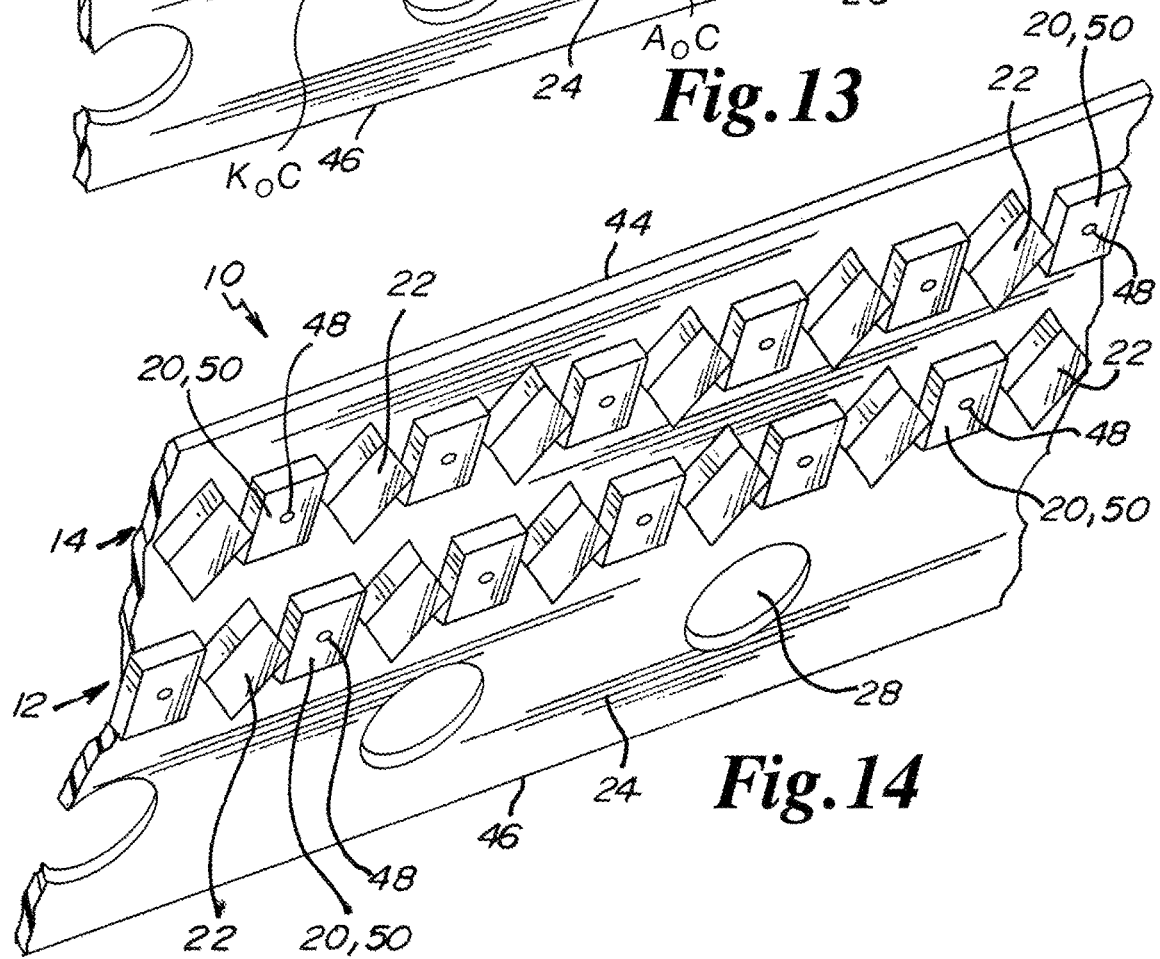

MULTI-ROW CARRIER TAPE WITH ALTERNATING, STAGGERED DUMMY POCKETS

CROSS-REFERENCE TO RELATED APPLICATIONS

This application claims the benefit of U.S. Provisional Patent Application Ser. No. 62/769,673 filed Nov. 20, 2018, which is incorporated by reference herein in its entirety.

FIELD OF THE INVENTION

Generally the invention is directed to carrier tapes which are used for bulk transport of components used in the manufacture of other devices. The inventive carrier tapes include variations in the number of rows of pockets and the use of dummy pockets having different sizes, shapes, spacing, positioning, groupings, and/or patterns. These features facilitate transportation, reduce damage, loss of components, nesting, and the undesirable attachment of a component to a cover tape during transportation.

BACKGROUND

Current carrier tapes have a single row of pockets spaced at repetitive pitches for protecting and transporting components for devices from a component manufacturer to a device manufacturer. In some instances, components transported in the carrier tape pockets may be damaged when rolled onto a transport reel.

In the past, carrier tapes wound upon a reel frequently aligned the device pockets vertically relative to each other. In turn, during transportation, the device pockets have nested relative to each other, where a device pocket aligned directly above another device pocket has caused the upper device pocket to be pressed downwardly into the device pocket immediately below. In this undesirable configuration a transported component may become damaged or may become adhered to the inside or underside of a cover tape disposed over the device pocket.

The unwinding of the carrier tape from a reel and manufacture of a device is frequently performed by robotic equipment having grasping members. The robotic equipment has been programmed to remove a component from an individual device pocket which is to be positioned at an exact location. If a component is adhered to the inside or underside of the cover tape, then the component will be absent from the device pocket, which in turn may result in the shutdown of an assembly line costing a manufacturer time and expense. Further a damaged component if not detected may be incorporated into a device, causing the device to fail to operate and/or perform the desired functions. The failure of the device due to the damaged component will result in returns, increased testing, loss of market share, expenditure of repair time and resources, as well as the loss of reputation or goodwill for a device manufacturer.

The damage exposed to a component may be physical, such as a chip or a crack in the component, or the time and pressure exerted on the component may cause the component to become adhered to the lower surface of the cover tape as applied onto the top surface of the carrier tape.

Anti-nesting pocket configurations have been used on larger pockets to provide an extension that prevents the pockets from nesting onto each other during transportation of carrier tape reels. The extensions in the carrier tape may require a wider spacing of the pockets to be effective, thus increasing the overall cost of packaging.

The art referred to and/or described above is not intended to constitute an admission that any patent, publication or other information referred to herein is "prior art" with respect to this invention. In addition, this section should not be construed to mean that a search has been made or that no other pertinent information as defined in 37 C.F.R. § 1.56(a) exists.

All U.S. patents and applications and all other published documents mentioned anywhere in this application are incorporated herein by reference in their entireties.

Without limiting the scope of the invention, a brief description of some of the claimed embodiments of the invention is set forth below. Additional details of the summarized embodiments of the invention and/or additional embodiments of the invention may be found in the Detailed Description of the Invention below.

A brief abstract of the technical disclosure in the specification is provided for the purposes of complying with 37 C.F.R. § 1.72.

GENERAL DESCRIPTION OF THE INVENTION

The inventive carrier tape utilizes multiple adjacent rows of pockets, where the rows of device pockets and/or dummy pockets, or a combination of device pockets and dummy pockets are offset relative to an adjacent row of pockets. Regular or irregular spacing may be provided between vertically aligned device pockets and dummy pockets. The regular or irregular spacing between the vertically aligned device pockets and dummy pockets allows for sealing of cover tapes onto the areas of the carrier tape outside of the device pockets and dummy pockets. Each row of carrier tape pockets may be a series of alternating device pockets and dummy pockets in any desired combination. For example, every other pocket within a row may be a device pocket and then a dummy pocket. Alternatively, each device pocket may be separated from another device pocket by two, three, or more dummy pockets. Alternatively, two, three, or more device pockets may be adjacent to each other in a set and separated from an adjacent set of device pockets by one, two, three, or more dummy pockets. The groupings and sets of device pockets and dummy pockets is practically unlimited. The above description being a very limited number of alternative examples.

The dummy pockets may be larger than the device pockets in an $A_0D$, $B_0D$ or $K_0D$ directions. The enlargement of the dummy pocket dimensions is provided to position the dummy pockets for support by the flange and bridge area of the carrier tape adjacent to the device pockets, which in turn will not permit the depression of the cover tape downwardly into a device pocket, minimizing risk of contact between a component within a device pocket and the cover tape.

The rows of alternating sets, groupings, or individual device pockets and dummy pockets may be offset or staggered relative to each other, so that the effective pitch will be minimized. For example, two rows of 2 mm pitch device pockets may be offset, so that there is a device pocket every 1 mm in the direction of the carrier tape.

The shape of the dummy pockets may be of any geometric shape, such as, but not necessarily limited to, rectangular, diamond, dog-bone, irregular, or combination of those shapes in a repeating or random pattern.

In one embodiment the carrier tape includes an upper edge, a lower edge, a central portion, a horizontal first row of device pockets and dummy pockets and a second horizontal row of device pockets and dummy pockets, where each of the device pockets has a pocket opening and a first size dimension, and each of the dummy pockets has a second size dimension which is larger than the first size dimension.

In another embodiment, each of the device pockets of the first row is vertically aligned with one of the dummy pockets of the second row forming a vertically aligned first pair, and each of the device pockets of the second row is vertically aligned with one of the dummy pockets of the first row forming a vertically aligned second pair.

In another embodiment, the device pockets and the dummy pockets in the first row are separated from the dummy pockets and the device pockets in the second row by an equal vertical dimension.

In another embodiment, the first pair and the second pair are horizontally separated relative to each other along the length of the carrier tape by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

In another embodiment, the first pair and the second pair are vertically positioned relative to the upper edge of the carrier tape by at least one of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, and both an irregular increasing vertical separation dimension and an irregular decreasing vertical separation dimension in any combination.

In another embodiment, the device pockets are constructed and arranged for receipt of a component and the carrier tape is constructed and arranged for consecutive layering around a transportation reel.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

BRIEF DESCRIPTION OF THE DRAWINGS

FIG. 5 is an alternative top plan view of the multi-row carrier tape having device pockets and dummy pockets;

FIG. 6 is an alternative top plan view of the multi-row carrier tape having device pockets and dummy pockets;

FIG. 7 is an alternative top plan view of the multi-row carrier tape having device pockets and dummy pockets;

FIG. 8 is a partial cross-sectional side view taken along the line 8-8 of FIG. 7 of the multi-row carrier tape having device pockets and dummy pockets;

FIG. 13 is a bottom perspective view of an alternative multi-row carrier tape having device pockets and dummy pockets;

FIG. 14 is a bottom perspective view of an alternative multi-row carrier tape having device pockets and dummy pockets;

DETAILED DESCRIPTION OF THE PREFERRED EMBODIMENTS

Figure 1:
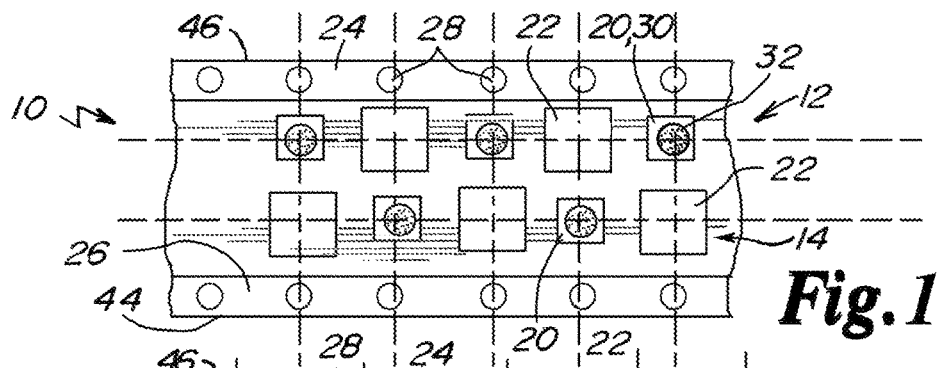
FIG. 1 is a top plan view of the multi-row carrier tape having device pockets and dummy pockets.

In general the multi-row carrier tape with alternating staggered dummy pockets will be identified by reference numeral 10. The carrier tape 10 is preferably of standard width as compared to known carrier tapes used for transportation of small components, where the components are incorporated into other devices during manufacture. In at least one embodiment, the carrier tape 10 is formed of a first row 12, a second row 14, an optional third row 16 and/or an optional fourth row 18 of device pockets 20 and dummy pockets 22. It should be noted that any number of rows of device pockets 20 and dummy pockets 22 may be included in the carrier tape 10, and that the number of rows of device pockets 20 and dummy pockets 22 identified above has been provided for illustrative purposes only, and should not be interpreted to be restrictive or limiting.

In at least one embodiment, the device pockets 20 function to receive a component 32 to be transferred to a manufacturing facility. The carrier tape 10 may be wound upon a reel 36 for ease of transportation. The carrier tape 10 in most embodiments includes a cover tape 34 which may be disposed over the device pockets 20 and dummy pockets 22 to deter separation of a component 32 from a device pocket 20 during transportation.

In at least one embodiment as described herein, a device pocket 20 will include a width dimension in a left to right or right to left direction, identified by $A_0C$. The device pocket 20 will also include a length or height dimension, top to bottom, identified by $B_0C$. The depth dimension of the device pocket 20 will further be identified by $K_0C$.

Similarly, a dummy pocket 22 will include a width dimension in a left to right direction, identified by $A_0D$. The dummy pocket 22 will also include a length or height dimension identified by $B_0D$. The depth dimension of the dummy pocket 22 will further be identified by $K_0D$. The $A_0$, $B_0$ and $K_0$ designations refer to the direction of the measurement of the dimensions of a pocket. The "C" designation represents the term "component" for a device pockets 20. The "D" designation represents the term "dummy" for the dummy pockets 22. Therefore, $A_0C$ represents the width dimension for a device pocket 20. The term $B_0D$ represents the height or length dimension for a dummy pocket 22.

In a preferred embodiment, at a minimum, the carrier tape 10 will include a first row 12 as well as a second row 14 of device pockets 20 and dummy pockets 22. The dummy pockets 22 will have a larger $A_0D$ dimension as compared to the $A_0C$ dimension of a device pocket 20. Alternatively the dummy pockets 22 will have a larger $B_0D$ dimension as compared to the $B_0C$ dimension of the device pocket 20. In another embodiment, the $A_0D$ as well as the $B_0D$ dimensions of the dummy pockets 22 will be larger than the $A_0C$ and $B_0C$ dimensions of the device pockets 20 in order to prevent vertical alignment and nesting of the device pockets 20 and/or dummy pockets 22 on a reel 34 during transportation of a carrier tape 10 loaded with components 32.

In at least one embodiment, the dummy pockets 22 will have at least one, and preferably two dimensions of the $A_0D$ and $B_0D$ which are larger than the respective dimensions selected for the $A_0C$ and $B_0C$ for the device pockets 20. In addition, the $K_0D$ dimension may be greater than the $K_0C$ dimension.

In at least one embodiment, each first row 12, second row 14, third row 16, and/or fourth row 18 of device pockets 20 and dummy pockets 22 will alternate the device pockets 20 and dummy pockets 22 in any desired number, set, sequence, combination, alignment, and/or staggering relative to the same row, or to an adjacent row of device pockets 20 or dummy pockets 22 on the carrier tape 10.

For example, in one simplified embodiment, the first row 12 will initiate with a device pocket 20 and consecutively alternate adjacent pockets within the first row 12 between device pockets 20 and dummy pockets 22. Simultaneously, the second row 14 will initiate with a dummy pocket 22 vertically aligned with the initial device pocket 20 of the first row 12. In the second row 14 the dummy pockets 22 and device pockets 20 will consecutively alternate. Therefore, within the carrier tape 10, a dummy pocket 22 of the second row 14 will be vertically aligned with a device pocket 20 of a first row 12. Also, a device pocket 20 of a second row 14 will be vertically aligned with a dummy pocket 22 of a first row 12.

In this simplified embodiment, any nesting or compression, and the associated damage to, or adherence of, a component 32 relative to a device pocket 20 or cover tape 34 would be minimized as a result of the dummy pockets 22 having an increased individual or combination of dimensions for $A_0D$, $B_0D$ or $K_0D$ relative to the $A_0C$, $B_0C$, or $K_0C$ dimensions. The dummy pockets 22 being larger, will not nest within the interior of a device pocket 20 transporting a component 32. Also, alternating the device pockets 20 and dummy pockets 22 will reduce vertical alignment of a device pocket 20 above a dummy pocket 22.

Therefore, if any nesting were to occur, where the device pocket 20 nested downwardly into a dummy pocket 22, the dummy pockets 22 would not be transporting a component 32 and therefore no damage would occur.

In at least one embodiment, the device pockets 20 include standard pitch dimensions as used with carrier tape 10 such as for example 1 mm, 2 mm and 4 mm. Additional pitch dimensions may also be incorporated into the device pockets 20 as described herein. The pitch dimensions identified should not be construed as limiting the extensive number of available pitch dimensions for use in carrier tape 10.

In at least one embodiment as depicted in FIG. 1, the carrier tape 10 has a first row 12 and second row 14 of device pockets 20 and dummy pockets 22. In this embodiment, the carrier tape 10 includes an upper flange 24 and a lower flange 26. Alternatively, the carrier tape 10 may only include an upper flange 24. The upper flange 24, lower flange 26 or both the upper flange 24 and lower flange 26 may include a plurality of regularly spaced openings 28.

The openings 28 are constructed and arranged to receive a mechanical advancement mechanism such as a roller or disc having protrusions, where the protrusions are disposed in the openings 28. When the roller or disc is rotated then liner motion is transferred onto the carrier tape 10, advancing the carrier tape 10, device pockets 20 and/or dummy pockets 22 to a desired position, for removal of a cover tape 34 and automatic withdraw of a transported component 32 from the interior of a device pocket 20.

In at least one embodiment, as depicted in FIG. 1, immediately adjacent to the device pocket 20 is a dummy pocket 22. Moving from right to left, the device pockets 20 consecutively alternate with the dummy pockets 22. A representation of a component 32 is located within the interior of the device pockets 20. All of the device pockets 20 and dummy pockets 22 in the first row 12 are horizontally aligned and are equally spaced from each other along the length of the carrier tape 10.

In the second row 14 depicted in FIG. 1, a dummy pocket 22 is disposed vertically below each device pocket 20 of the first row 12. Moving right to left, the pocket immediately adjacent to a dummy pocket 22 is a device pocket 20. Thereafter, moving right to left, the dummy pockets 22 and device pockets 20 consecutively alternate.

All of the dummy pockets 22 and device pockets 20 of the first row 12 are equally spaced vertically relative to the device pockets 20 and dummy pockets 22 of the second row 14.

The device pockets 20 and dummy pockets 22 may be of a different shape. (FIG. 2) For example, a device pocket 22 may be square and a dummy pocket 22 may be hexagonal. Alternatively, the device pocket 20 may be hexagonal and the dummy pocket 22 may be square, provided that the relative shapes do not permit the insertion of the device pocket 20 within the interior of the dummy pocket 22.

In one embodiment, all of the device pockets 20 and dummy pockets 22 in the second row 14 are equally spaced from each other in the vertical and horizontal directions along the carrier tape 10, and are aligned with a respective device pocket 20 or dummy pocket 22 of the first row 12. In addition, all of the device pockets 20 and dummy pockets 22 which form the second row 14 may have the same shape as the device pockets 20 and dummy pockets 22 of the first row 12.

As depicted in FIG. 1, the second row 14 of device pockets 20 and dummy pockets 22 is staggered relative to the device pockets 20 and dummy pockets 22 of the first row 12 by a single pocket. This configuration of vertical alignment of one device pocket 20 and one dummy pocket 22 alternating between the first row 12 and second row 14 continues along the longitudinal length of the carrier tape 10.

In the embodiment depicted in FIG. 1, the device pockets 20 and dummy pockets 22 within the first row 12 and second row 14 are identical in shape, vertical alignment, horizontal alignment as well as vertical and horizontal spacing.

In at least one alternative embodiment, the shape of the device pockets 20 and dummy pockets 22 is not required to be square or rectangular. In other embodiments, the shape of the device pockets 20 as well as the dummy pockets 22 may be of any shape as desired for a particular application including but not limited to shapes such as for example square, rectangular, oval, circular, elliptical, triangular, hexagonal, pentagonal, octagonal, or dog-bone shape at the preference of an individual.

In addition, it should be noted that the size of the device pockets 20 and dummy pockets 22 utilized to transport a component 32 within the first row 12 and/or second row 14 may be any size as desired by an individual without sacrifice of the attributes identified herein. In other embodiments, the device pockets 20 as well as the dummy pockets 22 may have any desired separation distance between device pockets 20 and dummy pockets 22 as desired by an individual.

In one embodiment as depicted in FIG. 1, the consecutive alternating and staggered alignment between the device pockets 20 and dummy pockets 22 of the first row 12 relative to the second row 14 minimizes nesting and/or compression between consecutive layers of carrier tape 10 as transported on a reel 36.

As may be seen in FIG. 1, the dummy pockets 22 of the first row 12 and second row 14 have an increased size dimension as compared to the device pockets 20. The increased dimension of $A_OD$, $B_OD$ and/or $K_OD$ of a dummy pocket 22 of either the first row 12 or the second row 14 relative to the dimension of $A_OC$, $B_OC$, or $K_OC$ minimizes nesting and/or compression between consecutive layers of carrier tape 10 as transported on a reel 36. The oversized dummy pockets 22 of either the first row 12 or the second row 14 upon stacking of consecutive layers of carrier tape 10 upon a reel 36 place the perimeter of the oversized dummy pockets 22 to the exterior of the perimeter of the device pockets 20. Nesting and compression between stacked layers of carrier tape 10 is minimized.

As depicted in FIG. 1, the center of one device pocket 20 in a first row 12 is spaced for vertical alignment with the center of one dummy pocket 22 of a second row 14. Further the center of one dummy pocket 22 in a first row 12 is spaced for vertical alignment with the center of one device pocket 20 of a second row 14. Therefore, the device pockets 20 and dummy pockets 22 are regularly, evenly, and equally spaced relative to each other in the first row 12 and second row 14 in both the horizontal longitudinal direction as well as the vertical direction.

Figure 2:
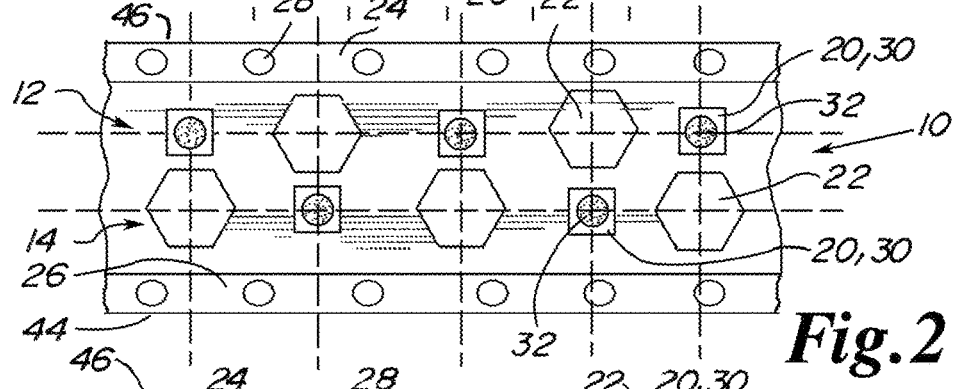
FIG. 2 is an alternative top plan view of the multi-row carrier tape having device pockets and dummy pockets.

In one embodiment as shown in FIG. 2, the first row 12 includes consecutive alternating device pockets 20 and dummy pockets 22. In FIG. 2, the initial pocket in the first row 12 is a device pocket 20. The second row 14 includes consecutive alternating dummy pockets 22 and device pockets 20. In the second row 14 the initial pocket is a dummy pocket 22. The device pockets 20 and dummy pockets 22 of the first row 12 are vertically aligned with the respective dummy pockets 22 and device pockets 20 of the second row 14. The device pockets 20 of the first row 12 are also staggered by a single pocket relative to the consecutive alternating device pockets 20 and dummy pockets 22 of the second row 14. The dummy pockets 22 and device pockets 20 are also horizontally aligned relative to each other in each of the first row 12 and second row 14.

In one embodiment as depicted in FIG. 2, the dummy pockets 22 of the first row 12 and the second row 14 have a larger size dimension as compared to the device pockets 20. The dummy pockets 22 in the first row 12 and second row 14 have a different shape as compared to the device pockets 22 of the first row 12 and second row 14. The difference in shape between the device pockets 20 and dummy pockets 22 within the first row 12 and second row 14 is sufficiently different to minimize risk of nesting and/or compression/compaction between consecutive layers of carrier tape 10 as transported on a reel 36. The risk of damage to a transported component 32 and/or the risk of a component 32 adhering to the inside or underside of a carrier tape 34 is also minimize improving the manufacture of a device.

As depicted in FIG. 2, the device pockets 20 and dummy pockets 22 in the first row 12 and second row 14 are equally spaced relative to each other along the longitudinal length of the carrier tape 10. In addition, the center of one device pocket 20 in a first row 12 is vertically aligned with the center of one dummy pocket 22 of a second row 14. Therefore, the device pockets 20 and dummy pockets 22 are regularly, evenly and equally spaced relative to each other in the first row 12 and second row 14 in both the horizontal longitudinal direction as well as the vertical direction.

Figure 4:
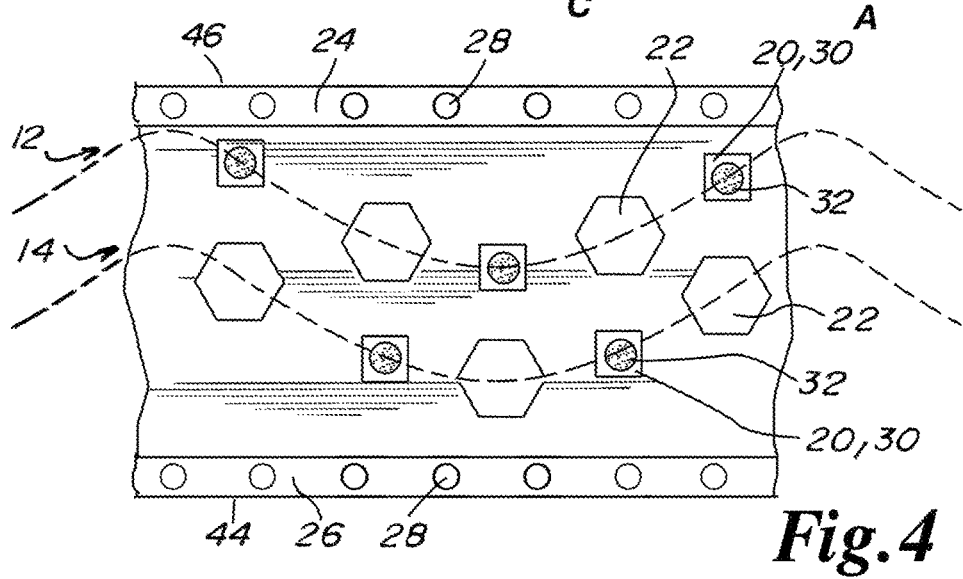
FIG. 4 is an alternative top plan view of the multi-row carrier tape having device pockets and dummy pockets.
Figure 9:
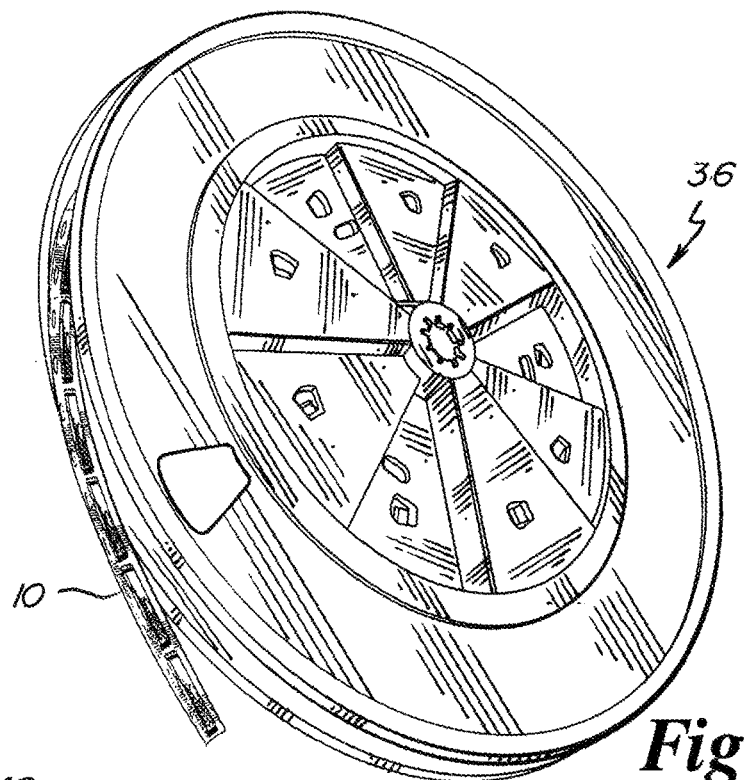
FIG. 9 is a perspective view of a reel transporting the multi-row carrier tape having device pockets and dummy pockets.

In another embodiment as depicted in FIG. 4 the dummy pockets 22 of the first row 12 and the second row 14 have a different shape as compared to the device pockets 20 of the first row 12 and second row 14. The dummy pockets 22 and device pockets 20 of the first row 12 and second row 14 have a constant horizontal separation/spacing dimension.

The embodiment depicted in FIG. 4 includes a number of features and elements as previously identified with reference to FIGS. 1 and 2. In the embodiment depicted in FIG. 4, the device pockets 20 and dummy pockets 22 are staggered, and are regularly, evenly and equally spaced relative to each other both in the vertical direction as well as the horizontal 12 direction.

The primary difference between the embodiment depicted in FIGS. 1 and 2 and the embodiment depicted in FIG. 4 relates to the relative positioning of each vertically aligned pair of device pockets 20 and dummy pockets 22 of the first row 12 or second row 14 relative to the upper flange 24 or lower edge 44.

As may be seen in FIG. 4 the device pockets 20 and dummy pockets 22 do not have an equal and constant separation distance relative to the upper flange 24 and lower edge 44. In at least one embodiment, each vertically aligned pair of device pockets 20 and/or dummy pockets 22 within the first row 12 and second row 14 may have an irregular spacing/distance dimension from the upper flange 24 and lower edge 44.

As may be seen in FIG. 4 the initial device pocket 20 of the first row 12 and the initial dummy pocket 22 and the second row 14 (right to left) may be slightly elevated and have a reduced distance dimension from the upper flange 24. Likewise, the initial device pockets 20 from the first row 12 and dummy pockets 22 from the second row 14 may have an increased distance dimension above the lower edge 44.

The second vertically aligned pair of device pockets 20 and dummy pockets 22 from the first row 12 and the second row 14 (right to left) may be horizontally separated from the first vertically aligned pair of device pockets 20 and dummy pockets 22 by a set and uniform dimension. However, the second pair of vertically aligned device pockets 20 and dummy pockets 22 from the first row 12 and the second row 14 may be centered between the upper flange 24 and lower edge 44 and centrally positioned relative to the carrier tape 10.

The third pair of vertically aligned device pockets 20 and dummy pockets 22 from the first row 12 and second row 14 may have a reduced distance dimension relative to the lower edge 44. Conversely, the third pair of vertically aligned pockets will have an increased distance dimension below the upper flange 24.

In at least one embodiment, the fourth pair of vertically aligned device pockets 20 and dummy pockets 22 is centrally positioned relative to the upper flange 24 and lower edge 44 as earlier described relative to the second pair of vertically aligned device pockets 20 and dummy pockets 22.

In at least one embodiment the fifth pair of vertically aligned device pockets 20 and dummy pockets 22 is upwardly positioned relative to the upper flange 24 as earlier described relative to the first pair of vertically aligned device pockets 20 and dummy pockets 22.

In some embodiments, the incremental progression of the distance from the upper flange 24 downwardly towards the lower edge 44, between each adjacent vertically aligned pair of device pockets 20 and dummy pockets 22, may be a regular dimension. Alternatively, the incremental progression of the distance from the lower edge 44 upwardly toward the upper flange 24, between each adjacent vertically aligned pair of device pockets 20 and dummy pockets 22, may be a regular dimension. However, in another embodiment, the incremental increase in the distance dimension or the incremental decrease in the distance dimension of the vertically aligned device pockets 20 and dummy pockets 22 from the upper flange 24 or lower edge 44 is not required to be regular and may be irregular. For example, a first vertically aligned pair of device pockets 20 and dummy pockets 22 may have a relative narrow distance dimension from the upper flange 24. The adjacent pair of vertically aligned dummy pockets 22 and device pockets 20 may be positioned any distance away from, or proximate to, the upper flange 24 or lower edge 44. Likewise, the third, fourth, fifth, sixth, and seventh vertically aligned pairs of device pockets 20 and dummy pockets 22 may be positioned at any desired distance dimension below the upper flange 24 and above the lower edge 44.

In some embodiments, the distance between the upper flange 24 and lower edge 44 for the adjacent vertically aligned pairs of device pockets 20 and dummy pockets 22 may be regularly increased and then regularly decreased in a manner similar to a sine wave. Alternatively, the vertically aligned pairs of device pockets 20 and dummy pockets 22 may be grouped into sets of adjacent vertically aligned device pockets 20 and dummy pockets 22 on the carrier tape 10. Each set of vertically aligned pairs of device pockets 20 and dummy pockets 22 may be positioned at any desired vertical distance dimension below or above a respective upper flange 24 and lower edge 44.

In another embodiment, the pairs or sets of adjacent vertically aligned device pockets 20 and dummy pockets 22 may be grouped or combined into any desired configuration or pattern. Alternatively, individual pairs of vertically aligned device pockets 20 and dummy pockets 22 may be combined with or be disposed between sets or groupings of vertically aligned pairs of device pockets 20 and dummy pockets 22, to provide any desired regular or irregular collection or sequence of adjacent pairs of device pockets 20 and dummy pockets 22 along a carrier tape 10. It should be noted that an almost infinite number of individual placement, groupings, sets, patterns, combinations and sequences may be provided for the vertically aligned pairs of device pockets 20 and dummy pockets 22 along the longitudinal length of the carrier tape 10.

Figure 3:
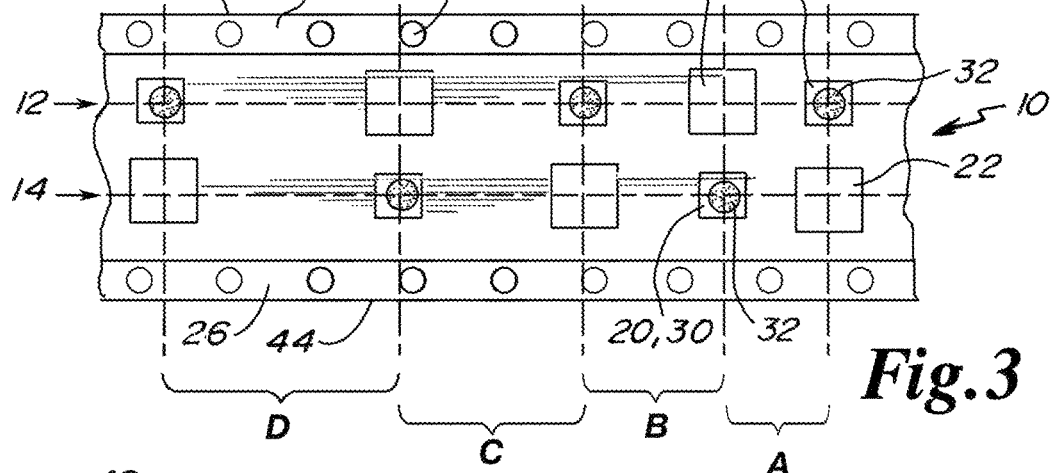
FIG. 3 is an alternative top plan view of the multi-row carrier tape having device pockets and dummy pockets.

In at least one embodiment as shown in FIG. 3, the shape of the individual device pockets 20 and dummy pockets 22 is the same. However, the dummy pockets 22 are larger in dimension than the device pockets 20. In addition, the device pockets 20 and dummy pockets 22 are both vertically and horizontally aligned on the carrier tape 10. In the alternative embodiment as depicted in FIG. 3 the separation dimension between adjacent pairs of vertically aligned device pockets 20 and dummy pockets 22 is variable. In this embodiment, the separation dimension between the first pair of vertically aligned device pockets 20 and dummy pockets 22 and the second pair of vertically aligned device pockets 20 and dummy pockets 22 is represented by "A". The separation dimension between the second pair of vertically aligned device pockets 20 and dummy pockets 22 and the third pair of vertically aligned device pockets 20 and dummy pockets 22 is represented by "B". Likewise, the separation dimension between the third and fourth pair of vertically aligned device pockets 20 and dummy pockets 22 is represented by "C". Further the separation dimension between the fourth and fifth pair of vertically aligned device pockets 20 and dummy pockets 22 is represented by "D".

In the embodiment depicted in FIG. 3 the distance dimension "D" is larger than the distance dimension "C". Therefore a larger separation dimension exists between the fourth and fifth pair of vertically aligned device pockets 20 and dummy pockets 22 relative to the separation dimension between the third and fourth pair of vertically aligned device pockets 20 and dummy pockets 22.

As depicted in the alternative embodiment shown in FIG. 3 the separation dimension "C" is greater than the separation dimension "B", and the separation dimension "B" is greater than the separation dimension "A".

It should be noted that a progressive increase in the separation dimension relative to adjacent pairs of vertically aligned device pockets 20 and dummy pockets 22 is not required, and any separation dimension may be selected for the distance between adjacent pairs of vertically aligned dummy pockets 20 and device pockets 22.

In some embodiments the separation dimension between adjacent pairs of vertically aligned device pockets 20 and dummy pockets 22 will incrementally and progressively increase up to a desired separation dimension, and then the separation dimension between adjacent pairs of vertically aligned device pockets 20 and dummy pockets 22 will then decrease. Alternatively, any irregular and/or non-uniform separation dimension between vertically aligned pairs of device pockets 20 and dummy pockets 22 may be selected dependent upon the requirements of a particular application.

Additionally, the separation distance between adjacent pairs of vertically aligned device pockets 20 and dummy pockets 22 may be provided in sets or groupings to provide any desired pattern, sequence or configuration. The numerous alternatives earlier described relative to FIGS. 1, 2 and 4 are equally applicable to the embodiment depicted in FIG. 3.

In another embodiment as depicted in FIG. 5, the separation dimension between adjacent pairs of vertically aligned device pockets 20 and dummy pockets 22 is not the same, and may vary in a regular increasing progression, a regular decreasing progression, and a regular increasing progression and a regular decreasing progression. Alternatively, the separation dimension between adjacent pairs of vertically aligned device pockets 20 and dummy pockets 22 may vary in an irregular increasing progression, an irregular decreasing progression, and an irregular increasing progression and an irregular decreasing progression. The earlier description of the alternative embodiments depicted in FIGS. 1 through 4, and particularly for FIG. 3, are equally applicable to the alternative embodiment depicted in FIG. 5. The difference between the embodiments depicted in FIG. 3 as earlier described and FIG. 5 is the shape of the dummy pockets 22. In the alternative embodiment depicted in FIG. 5 the shape of the dummy pockets 22 is different than the shape of the device pockets 20.

In at least one alternative embodiment as depicted in FIG. 6, the previous description related to the alternatives for the embodiments disclosed in FIGS. 1 through 5 and particularly FIGS. 3, 4, and 5 in combination are equally applicable to the embodiment depicted in FIG. 6. In the embodiment depicted in FIG. 6 the dummy pockets 22 are larger in size as compared to the device pockets 20. In addition, the separation dimension between adjacent vertically aligned pairs of device pockets 20 and dummy pockets 22 relative to the upper flange 24 and lower edge 44 is variable. Further, the horizontal separation dimension between adjacent pairs of vertically aligned device pockets 20 and dummy pockets 22 is variable.

The spacing of the vertically aligned pairs of device pockets 20 and dummy pockets 22 relative to the upper flange 24 and lower edge 44 may be constant, or may be a regular increasing progression, a regular decreasing progression, both a regular increasing progression and a regular decreasing progression, an irregular increasing progression, an irregular decreasing progression, both an irregular increasing progression and an irregular decreasing progression in any or all alternative combinations.

The spacing of the vertically aligned pairs of device pockets 20 and dummy pockets 22 horizontally along the longitudinal length of the carrier tape 10 may be constant or may be a regular increasing progression, a regular decreasing progression, both a regular increasing progression and a regular decreasing progression, an irregular increasing progression, an irregular decreasing progression, both an irregular increasing progression and an irregular decreasing progression in any or all alternative combinations.

It should be noted that any one or more of the spacing alternatives described for the pairs of device pockets 20 and dummy pockets 22 relative to the upper flange 24 and lower edge 44 may be combined with any one or more of the spacing alternatives described for the pairs of device pockets 20 and dummy pockets 22 along the longitudinal length of the carrier tape 10 in any and all combinations.

In at least one embodiment as depicted in FIG. 13, the underside of a carrier tape 10 is shown. In FIG. 13, the device pockets 20 alternate with the dummy pockets 22 within the first row 12 and second row 14. In addition, a uniform sized gap 38 separates each device pocket 20 from each dummy pocket 22. In FIG. 13 the $A_0C$, $B_0C$, $K_0C$, $A_0D$, $B_0D$, and $K_0D$ dimensions are identified.

As may be seen in one embodiment as shown in FIG. 14 the underside of the carrier tape 10 is shown having a first row 12 and a second row 14. In the first row 12 and second row 14 device pockets 20 are square in shape and the consecutively alternating dummy pockets 22 are diamond shaped.

Figure 18:
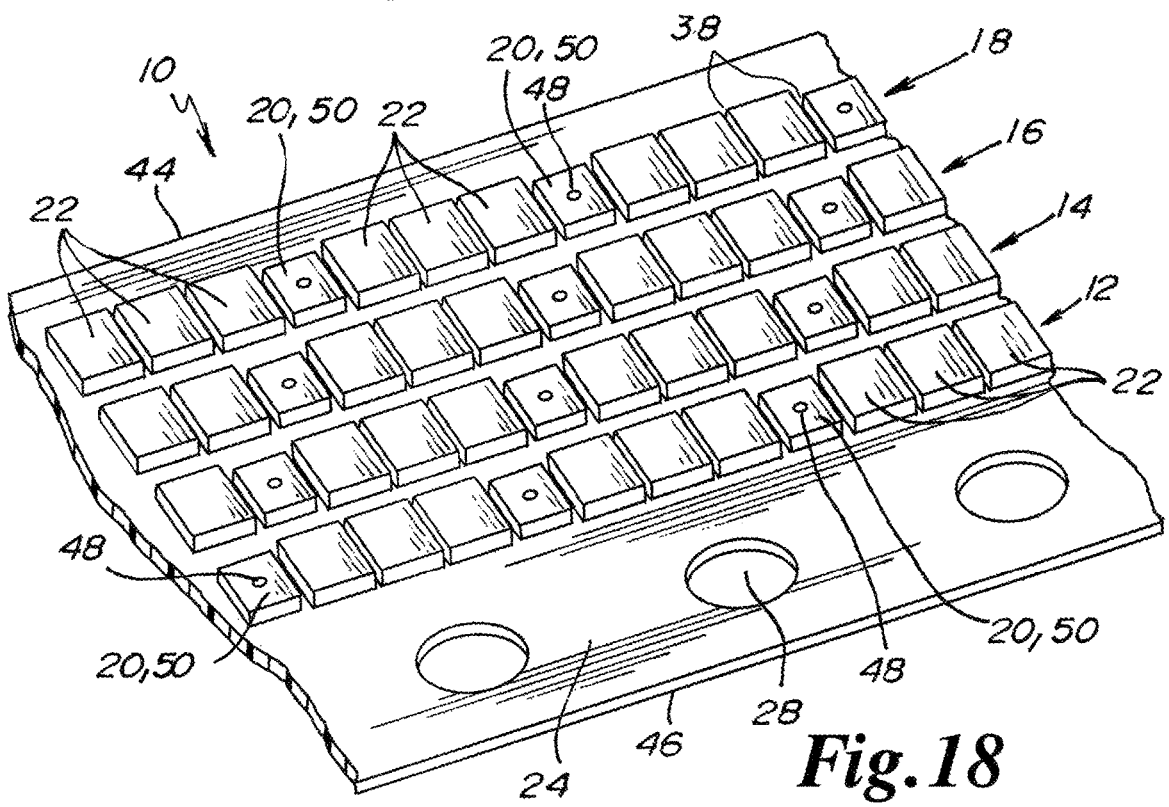
FIG. 18 is a bottom perspective view of an alternative multi-row carrier tape having device pockets and dummy pockets.
Figure 19:
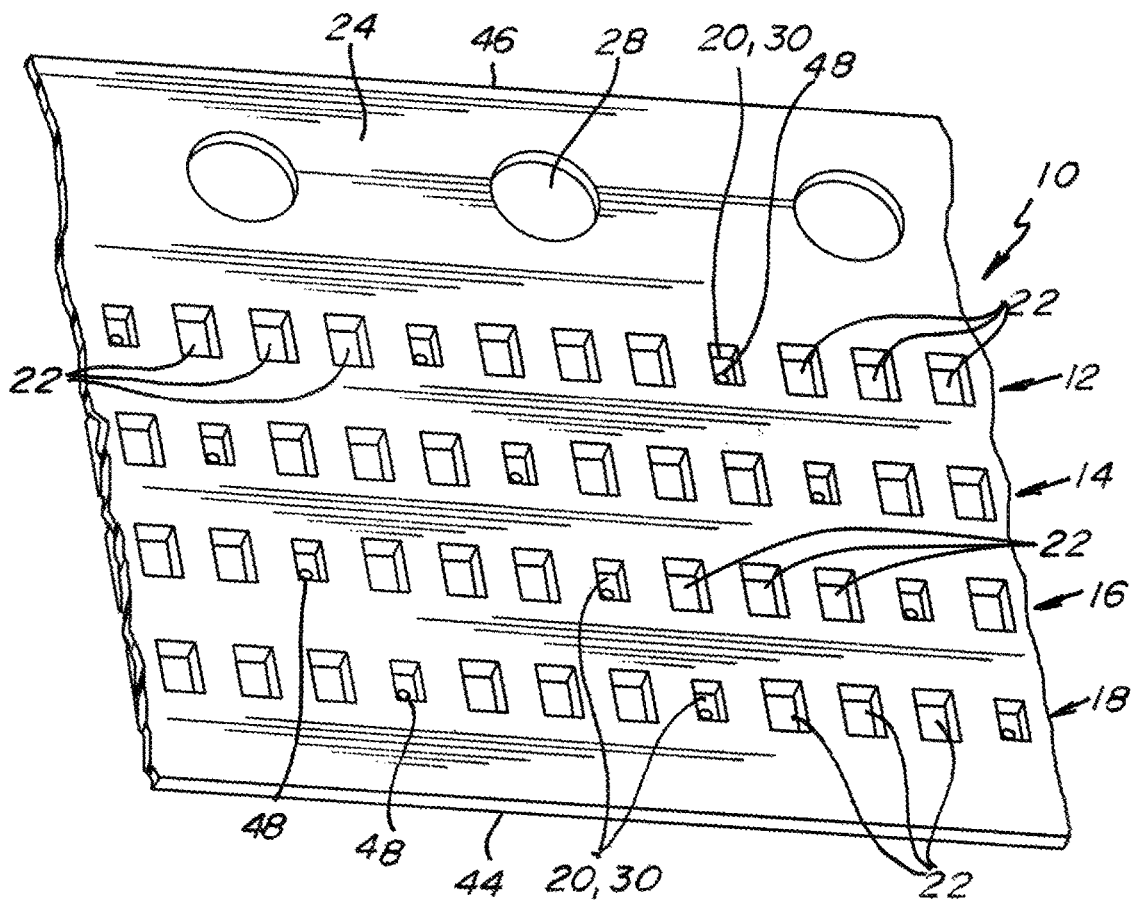
FIG. 19 is a top perspective view of an alternative multi-row carrier tape having device pockets and dummy pockets.
Figure 20:
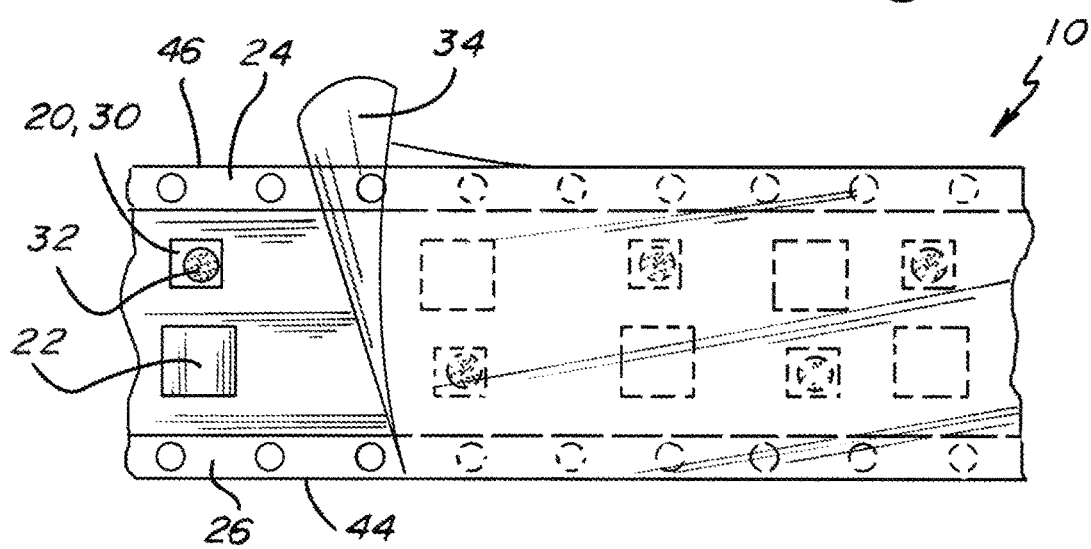
FIG. 20 is an alternative top plan view of the multi-row carrier tape having device pockets and dummy pockets.

In one alternative embodiment as may be seen in FIGS. 18 and 19, a first row 12, second row 14, third row 16 and fourth row 18 of device pockets 20 and dummy pockets 22 are shown forming the carrier tape 10. In the embodiment depicted in FIG. 18 the underside of the carrier tape 10 is shown.

In the embodiment shown in FIGS. 18 and 19, the fourth row 18 initiates with a device pocket 20. Moving right to left the next three adjacent pockets are dummy pockets 22. The fifth pocket is a device pocket 20 followed by three additional dummy pockets 22. The fourth row 18 is formed of a set or pattern of one device pocket 20 being separated from an adjacent device pocket 20 by three intermediate dummy pockets 22.

In the embodiment shown in FIGS. 18 and 19, the third row 16 initiates with a dummy pocket 22 followed immediately by a device pocket 20 moving right to left. The next three pockets in the third row 16 after the device pocket 20 are dummy pockets 22. Adjacent to the three consecutive dummy pockets 22 is located another device pocket 20. In the third row 16, adjacent device pockets 20 are also separated from each other by three intermediate dummy pockets 22. The third row 16 is offset relative to the fourth row 18 by a single dummy pocket 22.

In the embodiment shown in FIGS. 18 and 19, the second row 14 initiates with two consecutive dummy pockets 22 followed by a device pocket 20 moving right to left. The next three pockets after the device pocket 20 in the second row 14 are dummy pockets 22. Adjacent to the three consecutive dummy pockets 22 is another device pocket 20. In the second row 14, adjacent device pockets 20 are separated from each other by three intermediate dummy pockets 22. The second row 14 is offset relative to the fourth row 18 by two dummy pockets 22.

In the embodiment shown in FIGS. 18 and 19, the first row 12 initiates with three consecutive dummy pockets 22 followed by a device pocket 20 moving right to left. Three dummy pockets 22 are positioned on each side of a device pocket 20. In the first row 12, adjacent device pockets 20 are separated from each other by three dummy pockets 22. The first row 12 is offset relative to the fourth row 18 by three dummy pockets 22.

As may be seen in FIGS. 18 and 19, a gap 38 separates each adjacent dummy pocket 22 or device pocket 20.

Continuing to refer to FIGS. 18 and 19, each dummy pocket 22 has the identical dimensions for $A_0D$, $B_0D$ and $K_0D$. Each dummy pocket 22 and/or device pocket 20 of the first row 12, second row 14, third row 16, and fourth row 18 is vertically aligned as well as horizontally aligned along the carrier tape 10, with uniform spacing between the respective device pockets 20 and dummy pockets 22.

In FIGS. 18 and 19, each device pocket 20 has a smaller $A_0C$, $B_0C$ and $K_0C$ dimension as compared to the $A_0D$, $B_0D$ and $K_0D$ dimensions of the dummy pockets 22.

It should be noted that the device pockets 20 may consecutively alternate with the dummy pockets 22 within any of the first, second, third and fourth rows 12, 14, 16 and 18 respectively. In addition, any combination of dummy pockets 22 and device pockets 20 may be used in the first row 12, second row 14, third row 16, and fourth row 18.

For example, the first row 12 may include consecutively alternating dummy pockets 22 and device pockets 20. Simultaneously, the third row 16 may initiate with a dummy pocket 22 and have a device pocket 20 being immediately adjacent to the dummy pocket 22. (Right to left) The next adjacent device pocket 20 may be separated by two dummy pockets 22. The next adjacent device pocket 20 may be separated from the previous device pocket 20 by three dummy pockets 22. The next adjacent device pocket 20 may be separated from the previous device pocket 20 by four dummy pockets 22. Simultaneously, in the second row 14 each device pocket 20 may be separated from an adjacent device pocket 20 by a uniform two dummy pockets 22. Simultaneously, the fourth row 18 may regularly separate adjacent device pockets 20 by three dummy pockets 22. In alternative embodiments, any of the first row 12, second row 14, third row 16 and fourth row 18 may include any pattern, sequence, combination, and/or set of device pockets 20 and dummy pockets 22 as desired.

It should also be noted that in FIGS. 18 and 19 the dummy pockets 22 in the first row 12 are not required to have the same shape or the same dimensions as the dummy pockets 22 in the second row 14, third row 16 and/or fourth row 18. The dummy pockets 22 and the first row 12 may be square or rectangular and the dummy pockets 22 in the second row 14 may be oval or diamond or any other shape as desired. In addition, the shape of the dummy pockets 22 in the third row 16 and the fourth row 18 are not required to be identical to the shape of any dummy pockets 22 in either of the first row 12 and second row 14. Is contemplated that the carrier tape 10 may include any desired size or shape of device pockets 20 and dummy pockets 22, and is not restricted to the shapes and sizes identified in the figures which are intended to be illustrative and not restrictive.

In FIGS. 18 and 19, the $A_0D$, $B_0D$, and $K_0D$ dimensions between dummy pockets 22 may be identical or may be different at the preference of an individual. In addition, the dummy pockets 22 between the first row 12 and the second row 14, the second and third row 16, the third and the fourth row 18 may be different in size or shape in any one or more of the $A_0D$, $B_0D$, or $K_0D$ dimensions in any combination, set, sequence, or pattern.

Figure 11:
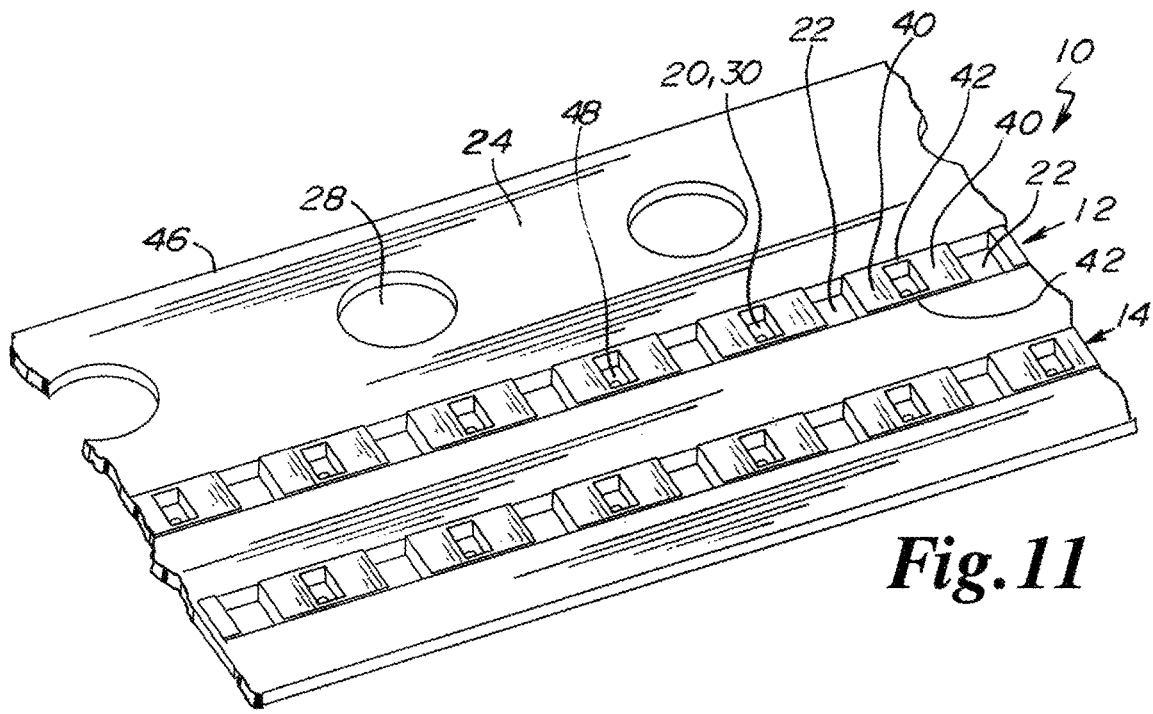
FIG. 11 is an alternative top perspective view of the multi-row carrier tape having device pockets and dummy pockets.
Figure 15:
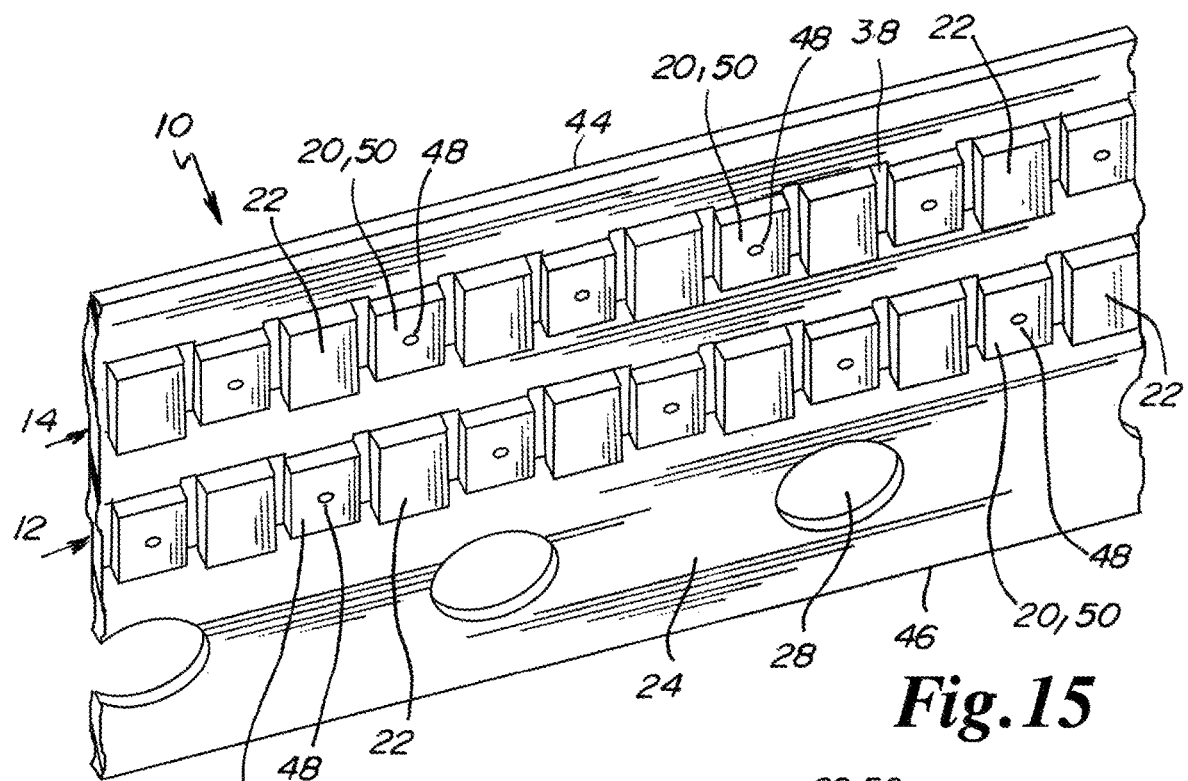
FIG. 15 is a bottom perspective view of an alternative multi-row carrier tape having device pockets and dummy pockets.

In at least one embodiment as may be seen in FIGS. 11 and 15, the carrier tape 10 includes a first row 12 and a second row 14 of device pockets 20 and dummy pockets 22. In the embodiment shown in FIGS. 11 and 15, a dummy pocket 22 is located on each of the opposite sides of the device pockets 20. In the embodiment depicted in FIGS. 11 and 15, a portion of the carrier tape 10 immediately adjacent to both sides of a device pocket 20 is enlarged 40. In addition, immediately above and below each device pocket 20 is located a bridge 42 of carrier tape 10. The incorporation of a bridge 42 of carrier tape 10 above and below a device pockets 20, as well as the use of the portions 40 of carrier tape 10 on either side of the device pocket 20 improves the structural integrity of the device pocket 20 minimizing risk of pocket collapse, fracture of a component, as well as a component 32 adhering to the interior or underside of a cover tape 34, when the carrier tape 10 is wound upon or removed from a reel 36.

Figure 16:
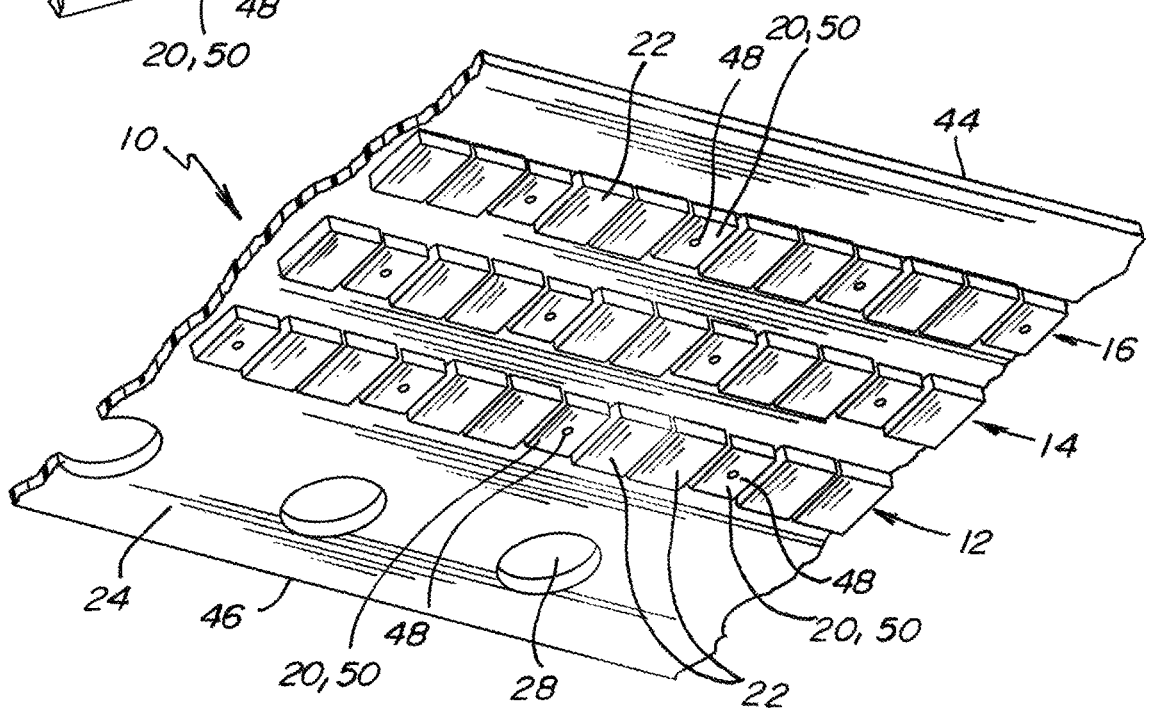
FIG. 16 is a bottom perspective view of an alternative multi-row carrier tape having device pockets and dummy pockets.
Figure 17:
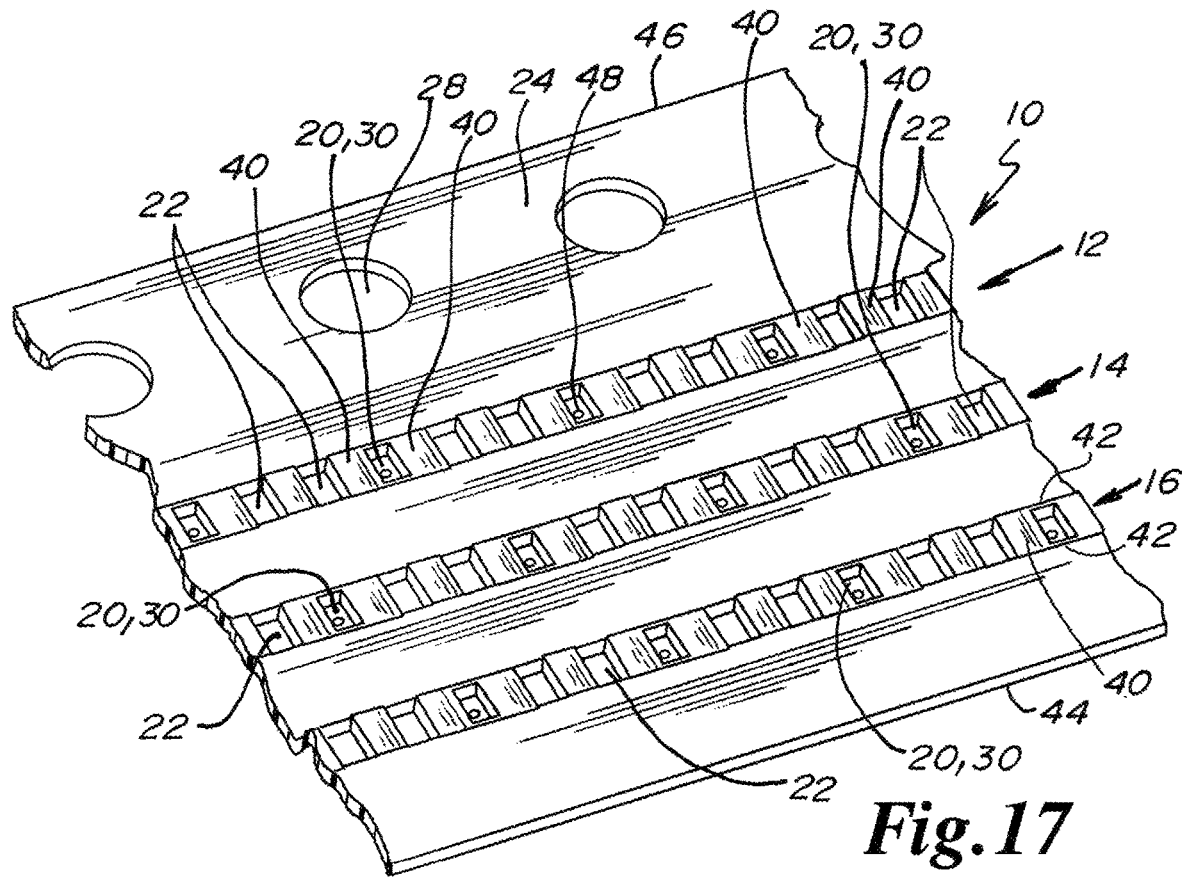
FIG. 17 is a top perspective view of an alternative multi-row carrier tape having device pockets and dummy pockets.

In at least one embodiment as may be seen in FIGS. 16 and 17 the carrier tape 10 includes a first row 12, a second row 14, and a third row 16 of device pockets 20 and dummy pockets 22. The previously described alternatives for the device pockets 20 and dummy pockets 22 are equally applicable to the carrier tapes 10 as shown in FIGS. 16 and 17. In FIGS. 16 and 17 the pattern/sequence of device pockets 20 and dummy pockets 22 is similar to the pattern/sequence of device pockets 20 and dummy pockets 22 as may be seen in FIGS. 11 and 15. In FIGS. 16 and 17, a portion 40 of carrier tape 10 is present on opposite sides of each device pocket 20. In addition, above and below each device pocket 20 is a bridge 42 of carrier tape 10 as previously described.

As may be seen in FIGS. 16 and 17, two dummy pockets 22 are located between each adjacent device pocket 20 as opposed to a single device pocket 20 being disposed between adjacent device pockets 22 as shown in FIGS. 11 and 15. It should be noted that in alternative embodiments, that the number of dummy pockets 22 disposed between adjacent device pockets 20 may be one, two, three, four or five or more at the discretion of an individual. In addition, the selected number of dummy pockets 22 to be disposed between adjacent device pockets 20 may be equal between a first row 12, a second row 14 and third row 16. Alternatively, the number of dummy pockets 22 between adjacent device pockets 20 may vary between a first row 12, second row 14, and third row 16. Further, no requirement exist to have the same number of dummy pockets 22 between adjacent device pockets 20 within any individual row on a carrier tape 10. The number of dummy pockets 22 between adjacent device pockets 20 may be random, variable, sequential, grouped into sets, form a desired pattern, or be equal depending upon the needs of a particular application. It should be noted that the numerous alternatives described for inclusion of dummy pockets 22 between adjacent device pockets 20 is equally applicable for carrier tape 10 having one, two, three, four or more rows of device pockets 20 and dummy pockets 22.

As may be seen in FIG. 11 and FIG. 17, the $A_0C$ dimension for the device pockets 20 does not extend all the way to the upper and lower edges of the respective trough. In this embodiment the $A_0D$ dimension for the dummy pockets does extend to the upper and lower edges of the respective trough and the $A_0D$ dimension for the dummy pockets 22 is therefore larger than the $A_0C$ dimension for the device pockets 22.

In this embodiment the device pockets 20 are formed from a larger block of material where the $A_0C$ dimension for the device pocket 20 is less than the $A_0D$ dimension for an adjacent dummy pocket 22. In this embodiment the device pocket is located between a first and second support wall and a portion of material extends between the first and second support wall above and below the device pocket (upper and lower bridges 42).

As may be seen in FIG. 16, the underside of the embodiment depicted in FIG. 17 is shown where the dummy pockets 22 have a larger $A_0D$, $B_0D$ and $K_0D$ dimension as compared to the respective $A_0C$, $B_0C$ and $K_0C$ dimensions selected for the device pockets 20.

In at least one alternative embodiment as depicted in FIG. 7 each dummy pocket 22 is of a unique shape such as a dog-bone shape. Any number of dog-bone shaped dummy pockets 22 may be disposed between adjacent device pockets 20 as identified herein. In at least one alternative embodiment, at least one of the first row 12, second row 14, third row 16 and/or fourth row 18 may include at least one row having dog-bone shaped dummy pockets 22. Alternatively, more than one row of dummy pockets 22 and device pockets 20 of a carrier tape 10 may be dog-bone shaped at the discretion of an individual.

In at least one embodiment, the carrier tape 10 has a thickness dimension of 0.21 mm plus or minus 0.05 mm. Alternative applications of the carrier tape 10 may have a thickness dimension of greater or less than 0.21 mm dependent upon the particular requirements of a component 32 to be transported.

In some embodiments, the device pockets 20 have an $A_0C$ dimension of 0.38 mm. Alternative embodiments of a carrier tape 10 may have an $A_0C$ dimension greater or less than 0.38 mm dependent on the particular requirements of a component 32 to be transported.

In some alternative embodiments, the device pockets 20 have a $B_0C$ dimension of 0.68 mm. Alternative embodiments of a carrier tape 10 may have a $B_0C$ dimension greater or less than 0.68 mm dependent on the particular requirements of a component 32 to be transported.

In some alternative embodiments, the device pockets 20 have a $K_0C$ dimension of 0.25 mm. Alternative embodiments of a carrier tape 10 may have a $K_0C$ dimension greater or less than 0.25 mm dependent on the particular requirements of a component 32 to be transported.

In some alternative embodiments, the dummy pockets 22 have an $A_0D$ dimension of 0.55 mm. Alternative embodiments of a carrier tape 10 may have an $A_0D$ dimension greater or less than 0.55 mm dependent on the particular requirements of a component 32 to be transported.

In at least one alternative embodiment, the dummy pockets 22 have a $B_0D$ dimension of 0.85 mm. Alternative embodiments of the carrier tape may have a $B_0D$ dimension greater or less than 0.85 mm dependent on the particular requirements of a component 32 to be transported.

In at least one embodiment, the dummy pockets 22 have a $K_0D$ dimension of 0.30 mm. Alternative embodiments of the carrier tape 10 may have a $K_0D$ dimension greater or less than 0.30 mm dependent on the particular requirements of a component 32 to be transported.

In at least one embodiment, the center to center separation distance between an adjacent device pocket 20 and a dummy pocket 22 in a first row 12 or second row 14 may be 1 mm. Alternatively, the center to center separation distance between an adjacent device pocket 20 and dummy pocket 22 in a first row 12 or second row 14 may be more or less than 1 mm dependent on the particular requirements of a component 32 to be transported.

In at least one embodiment, the center to center separation distance between adjacent device pockets 20 in a particular first row 12, second row 14, third row 16, or fourth row 18 may be 2 mm. Alternatively, the center to center separation distance dimension between adjacent device pockets 20 in a first row 12, second row 14, third row 16, or fourth row 18 may be more or less than 2 mm dependent on the particular requirements of a component 32 to be transported.

In one embodiment, the openings 28 may have a diameter dimension of 1.5 mm. The size of the openings 28 may however be larger or smaller than 1.5 mm dependent upon requirements of manufacturing equipment used to process the carrier tape 10.

In at least one embodiment, openings 28 are centered in the upper flange 24, where the centers of the openings are aligned and are 1.75 mm below the upper edge 46. In other embodiments, the center of the openings may be closer to the upper edge 46 and the separation distance may be less than 1.75 mm. Alternatively, the center of the openings 28 may be further away from the upper edge 46 and may be more than 1.75 mm away from the upper edge 46.

In at least one embodiment, the center of the portion of the carrier tape 10 including the first row 12, second row 14, third row 16, and/or fourth row 18 of device pockets 20 and dummy pockets 22 is approximately 3.5 mm below the center of the openings 28. The distance of the center of the carrier tape 10 including the first row 12 and second row 14 of device pockets 20 and dummy pockets 22 is therefore approximately 5.25 mm below the upper edge 46. In alternative embodiments, the center of the portion of the carrier tape 10 including the first row 12 or second row 14 of device pockets 20 or dummy pockets 22 may be more or less than 5.25 mm below the upper edge 46 of the carrier tape 10.

In at least one embodiment, the first row 12 of device pockets 20 and dummy pockets 22 may be 1.15 mm above the center of the portion of the carrier tape 10 including the first row 12, second row 14, third row 16, and/or fourth row 18. In this embodiment, the center of the first row 12 of device pockets 20 and dummy pockets 22 is approximately 4.1 mm below the upper edge 46 of the carrier tape 10. In alternative embodiments, the center of the first row 12 of device pockets 20 and dummy pockets 22 may be more or less than 4.1 mm below the upper edge 46 of the carrier tape 10.

In at least one alternative embodiment, the center of the second row 14 of device pockets 20 and dummy pockets 22 is positioned 1.15 mm below the center of the carrier tape 10 including the first row 12 or second row 14 of device pockets 20 and dummy pockets 22. In this embodiment, the second row 14 of device pockets 20 and dummy pockets 22 is approximately 6.4 mm below the upper edge 46. In alternative embodiments, the center of the second row 14 of dummy pockets 22 and device pockets 20 may be more or less than 6.4 mm below the upper edge 46 of the carrier tape 10.

In at least one embodiment, the carrier tape 10 has a dimension of approximately 8 mm between the upper edge 46 and the lower edge 44. In alternative embodiments, the distance dimension between the upper edge 46 and the lower edge 44 may be more or less than 8 mm.

In at least one alternative embodiment which includes a first row 12, second row 14, and third row 16 of device pockets 20 and dummy pockets 22 the dimension between the upper edge 46 and the lower edge 44 may be 12 mm. In alternative embodiments, the dimension between the upper edge 46 and lower edge 44 may be more or less than 12 mm.

In this embodiment, each device pockets 20 may be separated from an adjacent device pockets 20 by two dummy pockets 22. In this embodiment, the center to center separation distance between adjacent device pockets 20 in either the first row 12, second row 14, or third row 16 is approximately 3 mm. Alternatively, the center to center separation distance dimension between adjacent device pockets 20 may be more or less than 3 mm dependent upon the particular requirements of a component 32 to be transported.

In this embodiment, the center to center separation distance between an adjacent device pocket 20 and dummy pockets 22 may be 1 mm. Alternatively, the center to center separation distance between an adjacent device pocket 20 and dummy pockets 22 may be more or less than 1 mm dependent upon the particular requirements of a component 32 to be transported.

In this embodiment, the center to center separation distance dimension between a device pocket 20 and a dummy pockets 22 being separated from the device pocket 20 by an intermediate dummy pocket 22 is 2 mm. Alternatively, the center to center separation distance dimension between a device pocket 20 and a dummy pocket 22 being separated from a device pocket 20 by an intermediate dummy pocket 22 may be more or less than 2 mm dependent on the particular requirements of a component 32 to be transported.

In this alternative embodiment, the center of the second row 14 which is the center of the portion of the carrier tape 10 including the rows of device pockets 20 and dummy pockets 22, is approximately 7.25 mm below the upper edge 46 of the carrier tape 10. Alternatively, the separation dimension of the center of the second row 14 of device pockets 20 and dummy pockets 22 may be more or less than 7.25 mm below the upper edge 46 of the carrier tape 10.

In this alternative embodiment, the center of the first row 12 of device pockets 20 and dummy pockets 22 is approximately 4.9 mm below the upper edge 46 of the carrier tape 10. Alternatively, the separation dimension of the center of the first row 12 of device pockets 20 and dummy pockets 22 may be more or less than 4.9 mm below the upper edge 46 of the carrier tape 10.

In this alternative embodiment, the center of the third row 16 of device pockets 20 and dummy pockets 22 is approximately 9.6 mm below the upper edge 46 of the carrier tape 10. Alternatively, the separation dimension of the center of the third row 16 of device pockets 20 and dummy pockets 22 may be more or less than 9.6 mm below the upper edge 46 of the carrier tape 10.

As may be seen in FIG. 1 through FIG. 20 and particularly FIG. 8, in one preferred alternative embodiment, each of the device pockets 20 of the first row 12 and second row 14 include a pocket opening 48. Pocket openings 48 are located centrally through the bottom wall 50 of the device pockets 20. Pocket openings 48 may serve multiple purposes or functions during the transportation and/or withdraw of a component 32 during the manufacturing process.

In one embodiment, the pocket openings 48 assist in detection that a component 32 has actually been placed within a device pocket 20. In this embodiment, light is transmitted at the cover tape 34, or at the pocket opening 48, and the light is observed on the opposite side of the carrier tape 10 from the light source. An obstructed light source or shadow through the device pocket 20 and pocket opening 38 indicates the presence of a component 32 within the device pocket 20. The detection of a component 32 within a device pocket 20 improves the manufacturing processes.

In another alternative embodiment, during the manufacturing process, following the removal of the cover tape 34 from the carrier tape 10, an ejector pin may be inserted vertically through the pocket opening 48 and bottom wall 50 to engage a component 32. The component is then moved upwardly by the ejector pin for contact with a pickup of a manufacturing device for the removal of the component 32 from the interior of the device pocket 20.

In another alternative embodiment, the pocket opening 48 permits a vacuum to be applied to the exterior of the bottom wall 50 to draw the component 32 downwardly into the device pocket 20 and to hold the component 32 within the device pocket 20 during the withdraw of the cover tape 34 from the top of the carrier tape 10. The provision of vacuum to the bottom of the device pocket 20 through the pocket openings 48 minimizes a component 32 from bouncing or jumping out of a device pocket 20 during removal of the cover tape 34 from the carrier tape 10. The retention of the component 32 within the device pocket 20 improves the manufacturing process for a device.

Figure 10:
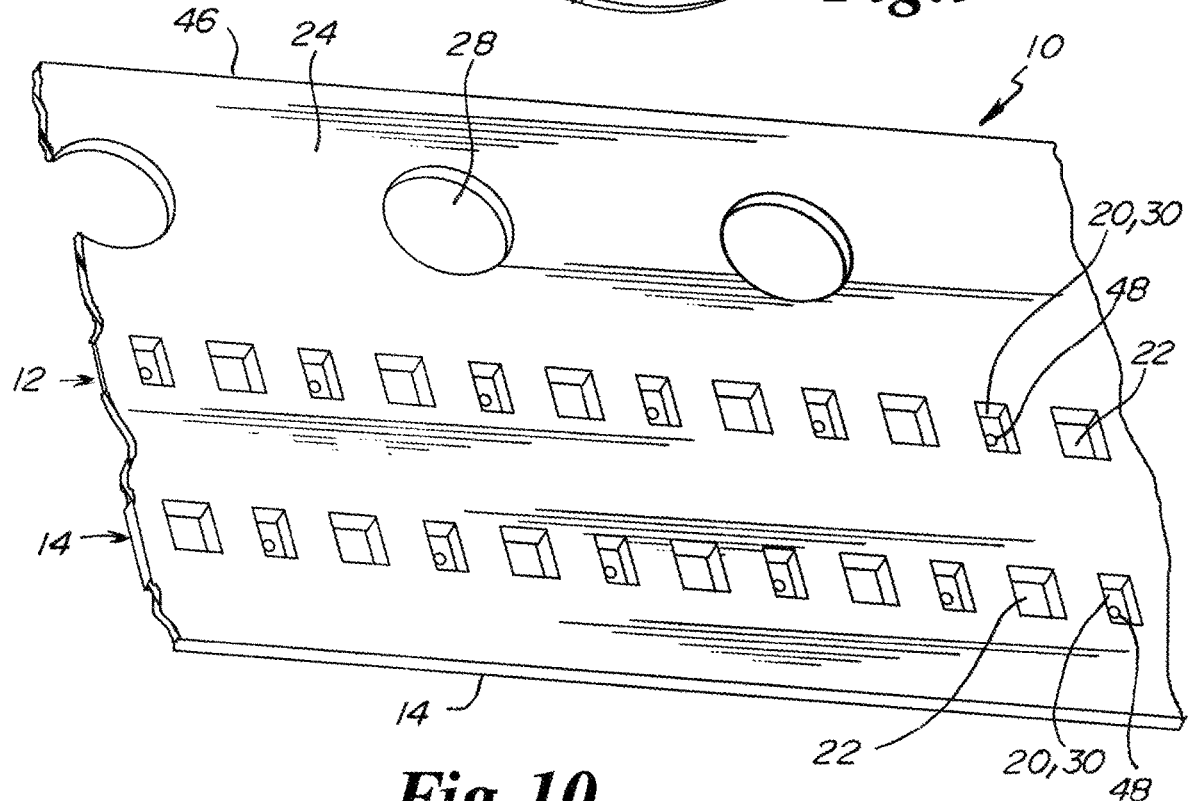
FIG. 10 is a top perspective view of an alternative multi-row carrier tape having device pockets and dummy pockets.

In one embodiment as shown in FIG. 10, the carrier tape 10 only includes an upper flange 24 having openings 28. The lower flange 26 and lower openings 28 have been omitted. In FIG. 10 a first row 12 and a second row 14 of device pockets 20 and dummy pockets 22 is shown. The features as previously described related to spacing, size, shape, pairings, configurations, patterns, sets and relative vertical or horizontal positioning are options which may be incorporated into a carrier tape 10 having only an upper flange 24 with openings 28. In FIG. 10 the first row 12 is shown to begin with a dummy pocket 22 vertically aligned with a device pocket 22 of the second row 14. (right to left) Adjacent device pockets 20 and dummy pockets 22 alternate in the respective rows.

Figure 12:
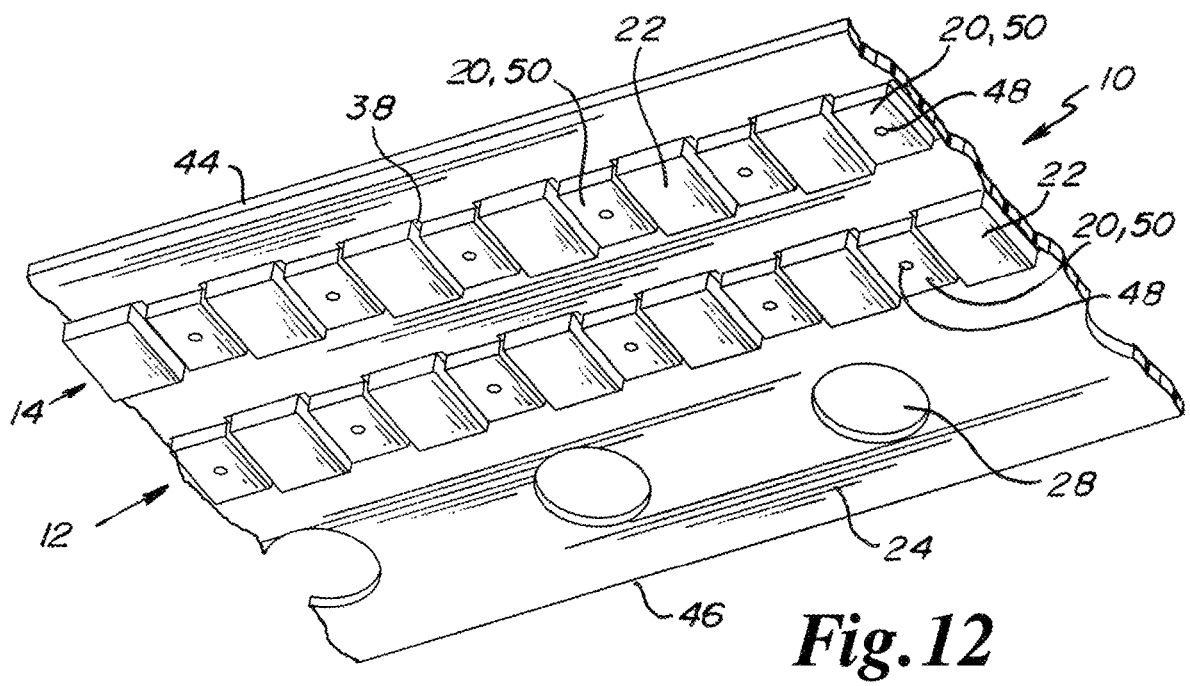
FIG. 12 is a bottom perspective view of an alternative multi-row carrier tape having device pockets and dummy pockets.

In at least one embodiment as depicted in FIG. 12, the underside of a carrier tape 10 having two rows is shown. The top of the carrier tape 10 may be similar to the embodiment earlier described in FIG. 11, which includes enlarged portions 40 adjacent to the sides of a device pocket 20 and a bridge 42 above and below a device pocket 20. In at least one embodiment in FIG. 12, the spacing between adjacent device pockets 20 and dummy pockets 22 has been reduced in dimension, which in turn has reduced the size of any gap 38. The features as previously described related to spacing, size, shape, pairings, configurations, patterns, sets and relative vertical or horizontal positioning are options which may be incorporated into a carrier tape 10 having only an upper flange 24 with openings 28. In FIG. 12 the first row 12 is shown to begin with a dummy pocket 22 vertically aligned with a device pocket 22 of the second row 14. (right to left) Adjacent device pockets 20 and dummy pockets 22 alternate in the respective rows.

It should be noted that any individual feature as described herein, within any of the identified embodiments, may be individually combined with any other individual feature, or any combination of features, or may be combined together in any number of multiple features, to provide a carrier tape 10 having oversized dummy pockets 22 and device pockets 20. The embodiments previously described being illustrative and not restrictive of the numerous combinations of features available for incorporation into a carrier tape 10.

In at least one alternative embodiment, each row of pockets may exclusively include either device pockets 20 or dummy pockets 22. In this embodiment an alignment/offset may exist between the first row 12 and the second row 14. In this embodiment where the device pockets 20 and the dummy pockets 22 are vertically aligned then the device pockets 20 and dummy pockets 22 will preferably have a different shape.

U.S. Pat. No. 6,293,404 entitled Non-Nesting Component Carrier Tape; U.S. Pat. No. 7,021,467 entitled Carrier Tape for Containing Good Therein and Container Using the Carrier Tape; and U.S. Pat. No. 7,654,392 entitled Carrier Tape Containing Goods Therein, and Container Using the Carrier Tape are incorporated herein by reference in their enteritis.

In a first alternative embodiment a carrier tape has an upper edge, a lower edge, and a central portion, a horizontal first row of device pockets and dummy pockets are located in the central portion, each of the device pockets has a pocket opening and a first size dimension, each of the dummy pockets has a second size dimension which is larger than the first size dimension, a horizontal second row of the device pockets and the dummy pockets is provided, each of the device pockets of the first row being vertically aligned with one of the dummy pockets of the second row forming a vertically aligned first pair, and each of the device pockets of the second row being vertically aligned with one of the dummy pockets of the first row forming a vertically aligned second pair, wherein the device pockets and the dummy pockets in the first row are separated from the dummy pockets and the device pockets in the second row by an equal vertical dimension, wherein the first pair and the second pair are also horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, both an irregular increasing horizontal separation dimension and irregular decreasing horizontal separation dimension in any combination, wherein the first pair and the second pair are vertically positioned relative to the upper edge by at least one of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, or both an irregular increasing vertical separation dimension and an irregular decreasing vertical separation dimension in any combination.

In a second alternative embodiment according to the first embodiment, the first pair and the second pair are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension, in any combination.

In a third alternative embodiment according to the first embodiment, the first pair and the second pair are horizontally separated relative to each other by at least three of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension, in any combination.

In a fourth alternative embodiment according to the first embodiment, the first pair and the second pair are vertically positioned relative to the upper edge by at least two of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, and both an irregular increasing vertical separation dimension and an irregular decreasing vertical separation dimension, in any combination.

In a fifth alternative embodiment according to the first embodiment, the first pair and the second pair are vertically positioned relative to the upper edge by at least three of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, and both an irregular increasing vertical separation dimension and an irregular decreasing vertical separation dimension, in any combination.

In a sixth alternative embodiment according to the first embodiment, the first pair and second pair are grouped into at least one horizontal set of first pairs and second pairs.

In a seventh alternative embodiment according to the first embodiment, the first pair and the second pair are grouped into at least one horizontal pattern of first pairs and second pairs.

In an eighth alternative embodiment according to the first embodiment, the device pockets have a device pocket shape and the dummy pockets have a dummy pocket shape and the device pocket shape is different than the dummy pocket shape.

In a ninth alternative embodiment according to the eighth embodiment, the carrier tape further comprises a horizontal third row of the device pockets and the dummy pockets in the central portion, wherein each of the device pockets of the third row are vertically aligned with one of the device pockets and the dummy pockets of the first row and one of the device pockets and the dummy pockets of said second row forming a vertically aligned first triple column and a vertically aligned second triple column, wherein the device pockets and the dummy pockets in the first row are separated from the dummy pockets and the device pockets in the second row by an equal vertical dimension and the device pockets and the dummy pockets in the second row are separated from the dummy pockets and the device pockets in the third row by an equal vertical dimension.

In a tenth alternative embodiment according to the ninth embodiment, the first triple column and the second triple column are horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension, in any combination.

In an eleventh alternative embodiment according to the ninth embodiment, the first triple column and the second triple column are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension, in any combination.

In a twelfth alternative embodiment according to the eleventh embodiment, the dummy pockets in the first row have a first dummy pocket shape, the dummy pockets in the second row have a second dummy pocket shape, the dummy pockets in the third row have a third dummy pocket shape.

In a thirteenth alternative embodiment according to the twelfth embodiment, the third dummy pocket shape is different from at least one of the first dummy pocket shape and the second dummy pocket shape.

In a fourteenth alternative embodiment according to the twelfth embodiment, the carrier tape further comprises a horizontal fourth row of the device pockets and the dummy pockets in the central portion, wherein each of the device pockets of the fourth row are vertically aligned with one of the device pockets and the dummy pockets of the first row, one of the device pockets and the dummy pockets of the second row, and one of the device pockets and the dummy pockets from the third row forming a vertically aligned first quad column and a vertically aligned second quad column, wherein the device pockets and the dummy pockets in the first row are separated from the dummy pockets and the device pockets in the second row by an equal vertical dimension, the device pockets and the dummy pockets in the second row are separated from the dummy pockets and the device pockets in the third row by an equal vertical dimension and the device pockets and the dummy pockets in the third row are separated from the dummy pockets and the device pockets in the fourth row by an equal vertical dimension.

In a fifteenth alternative embodiment according to the fourteenth embodiment, the first quad column and the second quad column are horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

In a sixteenth alternative embodiment according to the fifteenth embodiment, the first quad column and the second quad column are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension, in any combination.

In a seventeenth alternative embodiment according to the sixteenth embodiment, the dummy pockets in the fourth row have a fourth dummy pocket shape and the fourth dummy pocket shape is different from at least one of the first dummy pocket shape, the second dummy pocket shape and the third dummy pocket shape.

In an eighteenth alternative embodiment according to the tenth embodiment, the first triple column and the second triple column are grouped into at least one horizontal set of first triple columns and second triple columns.

In a nineteenth alternative embodiment according to the tenth embodiment, the first triple column and the second triple column are grouped into at least one horizontal pattern of first triple columns and second triple columns.

This completes the description of the preferred and alternate embodiments of the invention. Those skilled in the art may recognize other equivalents to the specific embodiment described herein which equivalents are intended to be encompassed by the claims attached hereto.

The above disclosure is intended to be illustrative and not exhaustive. This description will suggest many variations and alternatives to one of ordinary skill in this art. The various elements shown in the individual figures and described above may be combined or modified for combination as desired. All these alternatives and variations are intended to be included within the scope of the claims where the term "comprising" means "including, but not limited to".

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

I claim:

1. A carrier tape comprising:
an upper edge, a lower edge, and a central portion;
a horizontal first row of device pockets and dummy pockets in said central portion, each of said device pockets having a pocket opening and a first size dimension, each of said dummy pockets having a having a second size dimension which is larger than said first size dimension;
a horizontal second row of said device pockets and said dummy pockets, each of said device pockets of said first row being vertically aligned with one of said dummy pockets of said second row forming a vertically aligned first pair, and each of said device pockets of said second row being vertically aligned with one of said dummy pockets of said first row forming a vertically aligned second pair;
wherein said device pockets and said dummy pockets in said first row are separated from said dummy pockets and said device pockets in said second row by an equal vertical dimension; and
wherein said first pair and said second pair are horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, both an irregular increasing horizontal separation dimension and an irregular decreasing horizontal separation dimension in any combination.

2. The carrier tape according to claim 1, wherein said first pair and said second pair are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

3. The carrier tape according to claim 1, wherein said first pair and said second pair are horizontally separated relative to each other by at least three of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

4. The carrier tape according to claim 1, wherein said first pair and said second pair are vertically positioned relative to said upper edge by at least two of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, both an irregular increasing vertical separation dimension and an irregular decreasing vertical separation dimension in any combination.

5. The carrier tape according to claim 1, wherein said first pair and said second pair are vertically positioned relative to said upper edge by at least three of a constant vertical separation dimension, a regular increasing vertical separation dimension, a regular decreasing vertical separation dimension, both a regular increasing vertical separation dimension and a regular decreasing vertical separation dimension, an irregular increasing vertical separation dimension, an irregular decreasing vertical separation dimension, both an irregular increasing vertical separation dimension and an irregular decreasing vertical separation dimension in any combination.

6. The carrier tape according to claim 1, wherein said first pair and said second pair are grouped into at least one horizontal set of said first pairs and said second pairs.

7. The carrier tape according to claim 1, wherein said first pair and said second pair are grouped into at least one horizontal pattern of said first pairs and said second pairs.

8. The carrier tape according to claim 1, wherein said device pockets have a device pocket shape and said dummy pockets have a dummy pocket shape and said device pocket shape is different than said dummy pocket shape.

9. The carrier tape according to claim 1, said carrier tape further comprising a horizontal third row of said device pockets and said dummy pockets in said central portion, wherein each of said device pockets of said third row are vertically aligned with one of said device pockets or said dummy pockets of said first row and one of said device pockets or said dummy pockets of said second row forming a vertically aligned first column and a vertically aligned second column, wherein said device pockets and said dummy pockets in said first row are separated from said dummy pockets and said device pockets in said second row by an equal vertical dimension and said device pockets and said dummy pockets in said second row are separated from said dummy pockets and said device pockets in said third row by an equal vertical dimension.

10. The carrier tape according to claim 9, wherein said first column and said second column are horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

11. The carrier tape according to claim 9, wherein said first column and said second column are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

12. The carrier tape according to claim 11, wherein said dummy pockets in said first row have a first dummy pocket shape, said dummy pockets in said second row have a second dummy pocket shape, said dummy pockets in said third row have a third dummy pocket shape.

13. The carrier tape according to claim 12, wherein said third dummy pocket shape is different from at least one of said first dummy pocket shape and said second dummy pocket shape.

14. The carrier tape according to claim 12, said carrier tape further comprising a horizontal fourth row of said device pockets and said dummy pockets in said central portion, wherein each of said device pockets of said fourth row are vertically aligned with one of said device pockets or said dummy pockets of said first row, one of said device pockets or said dummy pockets of said second row, and one of said device pockets or said dummy pockets from said third row forming a vertically aligned third column and a vertically aligned fourth column, wherein said device pockets and said dummy pockets in said first row are separated from said dummy pockets and said device pockets in said second row by an equal vertical dimension, said device pockets and said dummy pockets in said second row are separated from said dummy pockets and said device pockets in said third row by an equal vertical dimension and said device pockets and said dummy pockets in said third row are separated from said dummy pockets and said device pockets in said fourth row by an equal vertical dimension.

15. The carrier tape according to claim 14, wherein said third column and said fourth column are horizontally separated relative to each other by at least one of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

16. The carrier tape according to claim 15, wherein said third column and said fourth column are horizontally separated relative to each other by at least two of a constant horizontal separation dimension, a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, and both an irregular increasing horizontal separation dimension and irregular decreasing horizontal separation dimension in any combination.

17. The carrier tape according to claim 16, wherein said dummy pockets in said fourth row have a fourth dummy pocket shape and said fourth dummy pocket shape is different from at least one of said first dummy pocket shape, said second dummy pocket shape and said third dummy pocket shape.

18. The carrier tape according to claim 10, wherein said first column and said second column are grouped into at least one horizontal set of said first columns and said second columns.

19. The carrier tape according to claim 10, wherein said first column and said second column are grouped into at least one horizontal pattern of said first columns and said second columns.

20. A carrier tape comprising:
an upper edge, a lower edge, and a central portion;

a horizontal first row of device pockets and dummy pockets in said central portion, each of said device pockets having a pocket opening and a first size dimension, each of said dummy pockets having a having a second size dimension which is larger than said first size dimension;

a horizontal second row of said device pockets and said dummy pockets, each of said device pockets of said first row being vertically aligned with one of said dummy pockets of said second row forming a vertically aligned first pair, and each of said device pockets of said second row being vertically aligned with one of said dummy pockets of said first row forming a vertically aligned second pair;

wherein said device pockets and said dummy pockets in said first row are separated from said dummy pockets and said device pockets in said second row by an equal vertical dimension; and wherein said first pair and said second pair are horizontally separated relative to each other by at least one of a regular increasing horizontal separation dimension, a regular decreasing horizontal separation dimension, both a regular increasing horizontal separation dimension and regular decreasing horizontal separation dimension, an irregular increasing horizontal separation dimension, an irregular decreasing horizontal separation dimension, both an irregular increasing horizontal separation dimension and an irregular decreasing horizontal separation dimension in any combination.

* * * * *